United States Patent
Yu et al.

(10) Patent No.: US 11,282,944 B2
(45) Date of Patent: Mar. 22, 2022

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Chia-Chi Yu, Hsinchu (TW); Jui Fu Hseih, Zhubei (TW); Yu-Li Lin, Kaohsiung (TW); Chih-Teng Liao, Hsinchu (TW); Yi-Jen Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/945,557

(22) Filed: Jul. 31, 2020

(65) Prior Publication Data

US 2021/0202714 A1    Jul. 1, 2021

Related U.S. Application Data

(60) Provisional application No. 62/955,404, filed on Dec. 30, 2019.

(51) Int. Cl.
*H01L 29/66* (2006.01)
*H01L 21/02* (2006.01)
(Continued)

(52) U.S. Cl.
CPC ...... *H01L 29/6681* (2013.01); *H01L 21/0217* (2013.01); *H01L 21/02164* (2013.01);
(Continued)

(58) Field of Classification Search
CPC .......... H01L 29/6681; H01L 21/02164; H01L 21/0217; H01L 21/02175; H01L 21/02178;
(Continued)

(56) References Cited

U.S. PATENT DOCUMENTS 8,962,400 B2    2/2015  Tsai et al.
9,093,514 B2    7/2015  Tsai et al.
(Continued)

FOREIGN PATENT DOCUMENTS

TW    201913819 A    4/2019
TW    201916353 A    4/2019
TW    201916365 A    4/2019

*Primary Examiner* — Zandra V Smith
*Assistant Examiner* — Andre C Stevenson
(74) *Attorney, Agent, or Firm* — McDermott Will & Emery LLP

(57) ABSTRACT

In a method, a first dielectric layer is formed over semiconductor fins, a second dielectric layer is formed over the first dielectric layer, the second dielectric layer is recessed below a top of each of the semiconductor fins, a third dielectric layer is formed over the recessed second dielectric layer, and the third dielectric layer is recessed below the top of the semiconductor fin, thereby forming a wall fin. The wall fin includes the recessed third dielectric layer and the recessed second dielectric layer disposed over the recessed third dielectric layer. The first dielectric layer is recessed below a top of the wall fin, a fin liner layer is formed, the fin liner layer is recessed and the semiconductor fins are recessed, and source/drain epitaxial layers are formed over the recessed semiconductor fins, respectively. The source/drain epitaxial layers are separated by the wall fin from each other.

20 Claims, 17 Drawing Sheets

(51) Int. Cl.
*H01L 29/78* (2006.01)
*H01L 21/311* (2006.01)
*H01L 29/08* (2006.01)
*H01L 29/06* (2006.01)

(52) U.S. Cl.
CPC .. *H01L 21/02175* (2013.01); *H01L 21/02178* (2013.01); *H01L 21/02181* (2013.01); *H01L 21/02189* (2013.01); *H01L 21/31111* (2013.01); *H01L 29/0653* (2013.01); *H01L 29/0847* (2013.01); *H01L 29/66545* (2013.01); *H01L 29/66636* (2013.01); *H01L 29/7848* (2013.01); *H01L 29/7851* (2013.01)

(58) Field of Classification Search
CPC ......... H01L 21/02181; H01L 21/02189; H01L 21/31111; H01L 29/0653; H01L 29/0847; H01L 29/66545; H01L 29/66636; H01L 29/7848; H01L 29/7851
See application file for complete search history.

(56) References Cited

U.S. PATENT DOCUMENTS

| | | | |
|---|---|---|---|
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 2017/0012042 | A1 | 1/2017 | Cai et al. |
| 2019/0326287 | A1 | 10/2019 | Liaw |
| 2020/0051868 | A1* | 2/2020 | Zang ................. H01L 29/66545 |
| 2020/0058766 | A1* | 2/2020 | Lee ................... H01L 21/31116 |

* cited by examiner

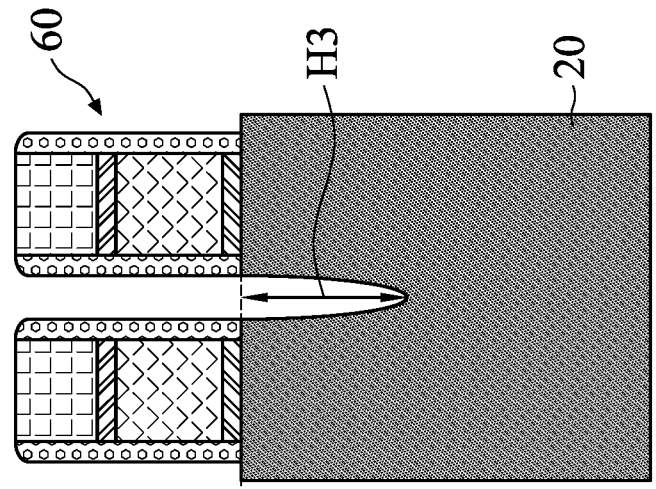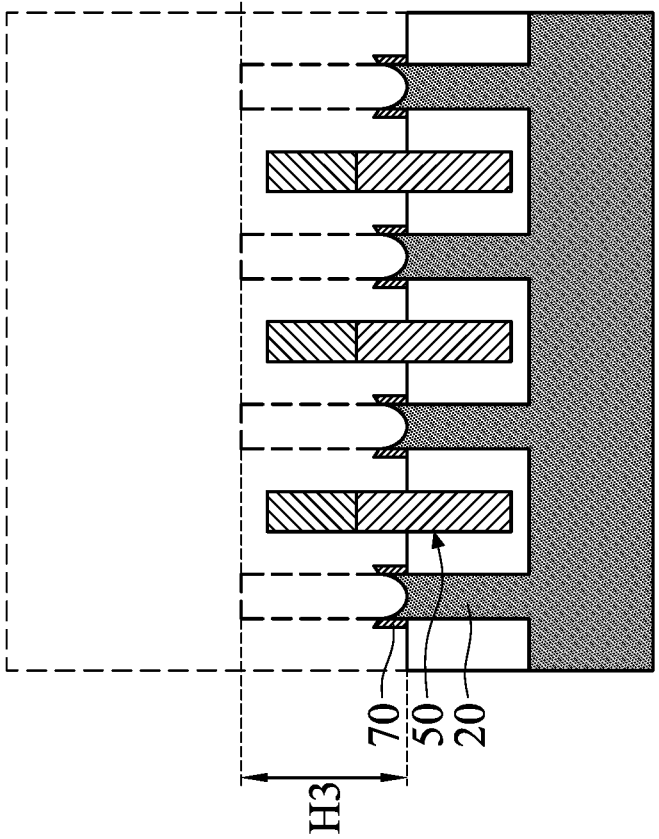
FIG. 14A
FIG. 14B

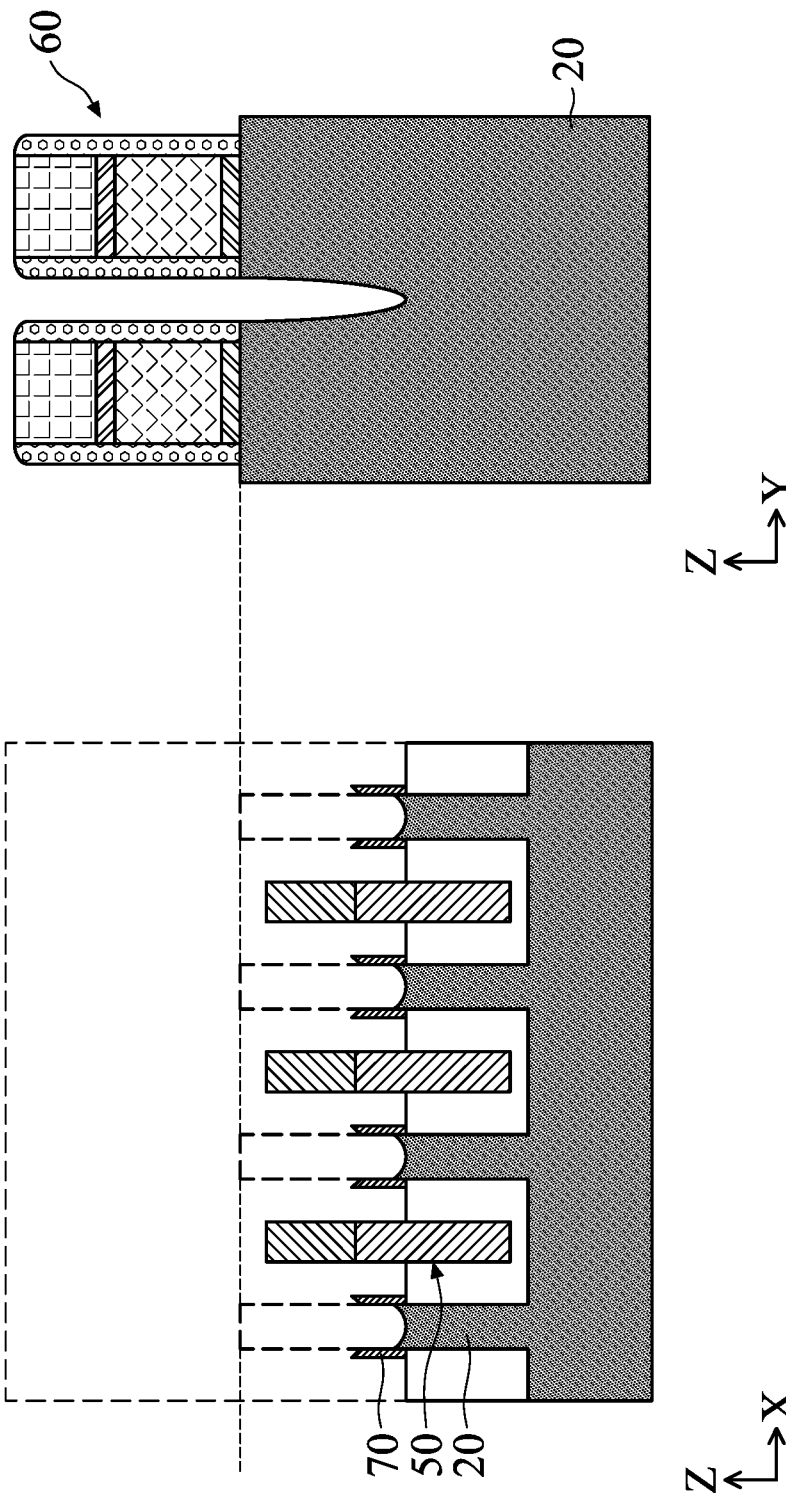

METHOD OF MANUFACTURING A SEMICONDUCTOR DEVICE AND A SEMICONDUCTOR DEVICE

RELATED APPLICATIONS

This application claims priority to U.S. Provisional Application No. 62/955,404 filed on Dec. 30, 2019, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the Fin FET utilizing, for example, silicon germanium (SiGe), silicon carbide (SiC), and/or silicon phosphide (SiP) may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 14A and 14B show one of the various stages of a sequential manufacturing operation of a semiconductor FET device according to an embodiment of the present disclosure.

FIGS. 16A and 16B show one of the various stages of a sequential manufacturing operation of a semiconductor FET device according to another embodiment of the present disclosure.

DETAILED DESCRIPTION

Figure 1:
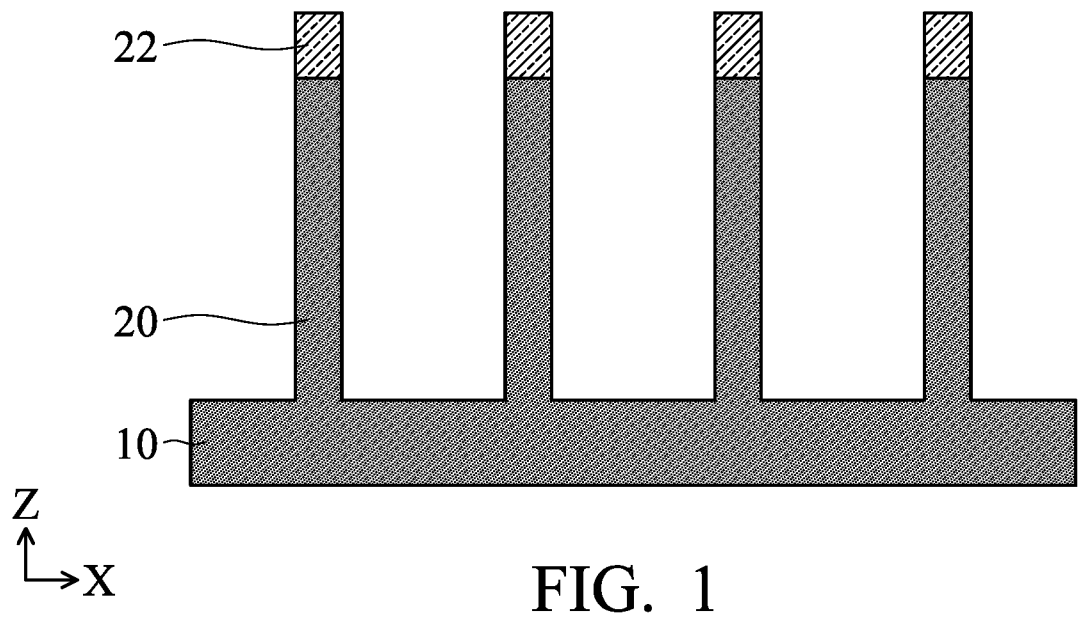
FIG. 1 shows one of the various stages of a sequential manufacturing operation of a semiconductor FET device according to an embodiment of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

One of the factors to determine device performance of a field effect transistor (FET), such as a fin FET (FinFET), is a shape of an epitaxial source/drain structure. In particular, when a source/drain region of a FinFET is recessed and then an epitaxial source/drain layer is formed therein, the etching substantially defines the shape of the epitaxial source/drain structure. Further, when two adjacent fin structures are closer to each other, the epitaxial layers undesirably merge with each other.

In the present disclosure, a wall fin structure (a dielectric dummy fin structure) is employed to physically and electrically separate adjacent source/drain epitaxial layers and to define the shape of the source/drain epitaxial layer. An optimal source/drain shape can improve a FinFET's Ion/Ioff current ratio, and can improve device performance.

FIGS. 1-13B show views of various stages of a sequential manufacturing operation of a semiconductor device according to the present disclosure. It is understood that additional operations may be provided before, during, and after the processes shown by FIGS. 1-13B, and some of the operations described below can be replaced or eliminated for additional embodiments of the method. The order of the operations/processes may be interchangeable.

As shown in FIG. 1, one or more fin structures 20 are fabricated over a substrate 10. The substrate 10 is, for example, a p-type silicon substrate with an impurity concentration in a range of about $1 \times 10^{15}$ cm$^{-3}$ to about $1 \times 10^{18}$ cm$^{-3}$. In other embodiments, the substrate 10 is an n-type silicon substrate with an impurity concentration in a range of about $1 \times 10^{15}$ cm$^{-3}$ to about $1 \times 10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 may be patterned by any suitable method. For example, the fin structures 20 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20. In some embodiments, a hard mask pattern 22 used to etch the substrate 10 remains on the top of the fin structure 20. The hard mask pattern 22 includes one or more layers of silicon oxide, silicon nitride, SiON and other suitable material, in some embodiments. In certain embodiments, the hard mask pattern 22 includes silicon nitride.

As shown in FIG. 1, four fin structures 20 protrude from the substrate 10 toward the Z direction, extend in the Y direction and are disposed adjacent to each other in the X direction with a constant pitch. However, the number of the fin structures is not limited to four. The numbers may be one, two, three or five or more. In addition, one or more dummy fin structures may be disposed adjacent to both sides of the fin structures 20 to improve pattern fidelity in patterning processes. The width of the fin structure 20 is in a range of about 5 nm to about 40 nm in some embodiments, and is in a range of about 7 nm to about 15 nm in certain other embodiments. The height of the fin structure 20 is in a range of about 100 nm to about 300 nm in some embodiments, and is in a range of about 50 nm to 100 nm in other embodiments. The space between the fin structures 20 is in a range of about 5 nm to about 80 nm in some embodiments, and may be in a range of about 7 nm to 20 nm in other embodiments. In some embodiments, a pitch of the fin structures is in a range from about 10 nm to 120 nm, and is in a range from about 14 nm to about 35 nm in other embodiments. One skilled in the art will realize, however, that the dimensions and values recited throughout the descriptions are merely examples, and may be changed to suit different scales of integrated circuits. In some embodiments, the Fin FET device is an n-type Fin FET. In other embodiments, the Fin FET device is a p-type Fin FET.

Figure 2:
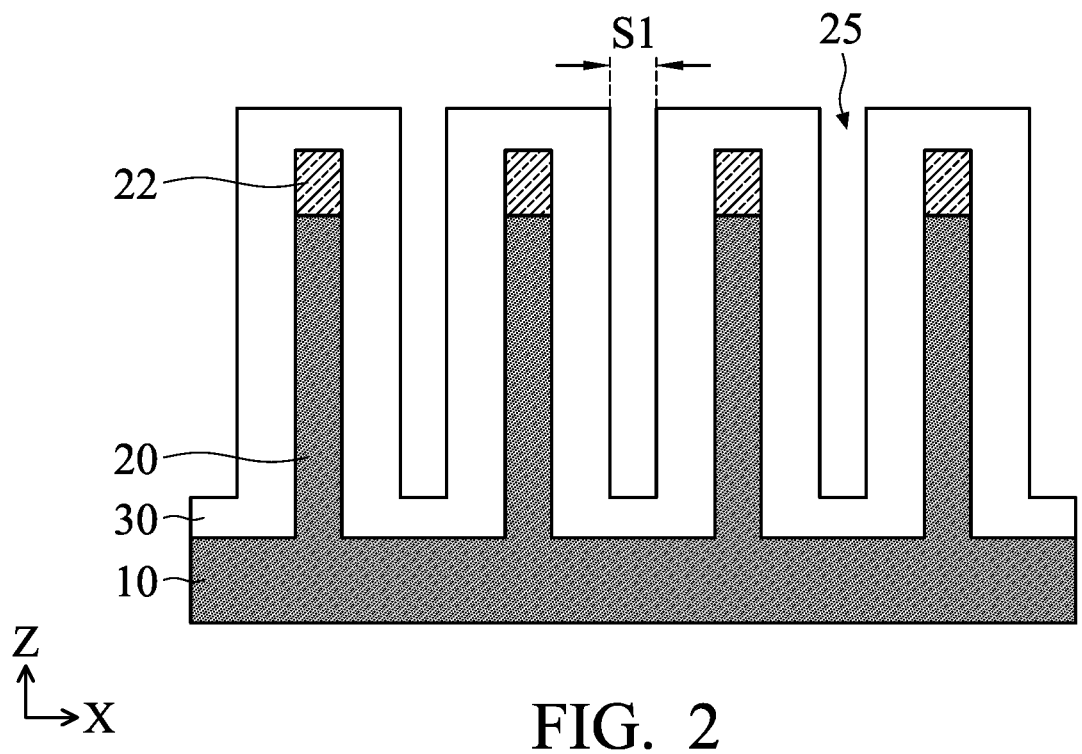
FIG. 2 shows one of the various stages of a sequential manufacturing operation of a semiconductor FET device according to an embodiment of the present disclosure.

After the fin structures 20 are formed, a first dielectric layer 30 is formed over the fin structures 20 as shown in FIG. 2. The first dielectric layer 30 includes one or more layers of insulating materials such as silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, silicon oxide is used as the first dielectric layer 30. In some embodiments, as shown in FIG. 2, the first dielectric layer 30 is conformally formed over the fin structures 20 such that a first space 25 is formed between adjacent fin structures. The thickness of the first dielectric layer 30 is adjusted so that the space S1 is in a range of about 5 nm to about 40 nm in some embodiments, and is in a range of about 7 nm to about 15 nm in certain embodiments.

Figure 3:
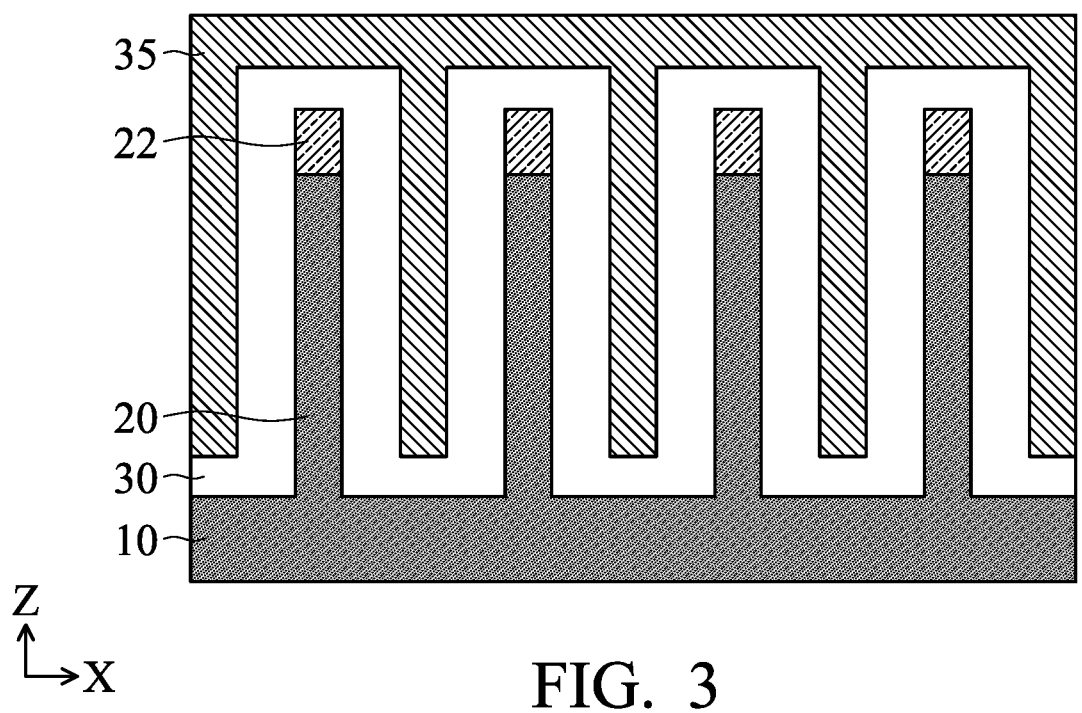
FIG. 3 shows one of the various stages of a sequential manufacturing operation of a semiconductor FET device according to an embodiment of the present disclosure.

After the first dielectric layer 30 is formed, a second dielectric layer 35 is formed over the first dielectric layer 30, as shown in FIG. 3. The material of the second dielectric layer 35 is different from the material of the first dielectric layer 30. In some embodiments, the second dielectric layer 35 includes one or more layers of insulating materials such as silicon oxide, silicon oxynitride or silicon nitride, SiOC, SiCN or SiOCN formed by LPCVD, plasma-CVD or ALD, or any other suitable film formation method. In some embodiments, the second dielectric layer 35 is made of silicon nitride. As shown in FIG. 3, the second dielectric layer 35 fully fills the first space 25 and covers the top of the first dielectric layer 30, in some embodiments. In other embodiments, a void is formed in the bottom part of the first space 25. In some embodiments, one or more additional dielectric layers are formed between the first dielectric layer 30 and the second dielectric layer 35. In some embodiments, after the second dielectric layer 35 is formed, a planarization operation, such as an etch-back process or a chemical mechanical polishing (CMP) process, is performed to planarize the upper surface of the second dielectric layer 35.

Figure 4:
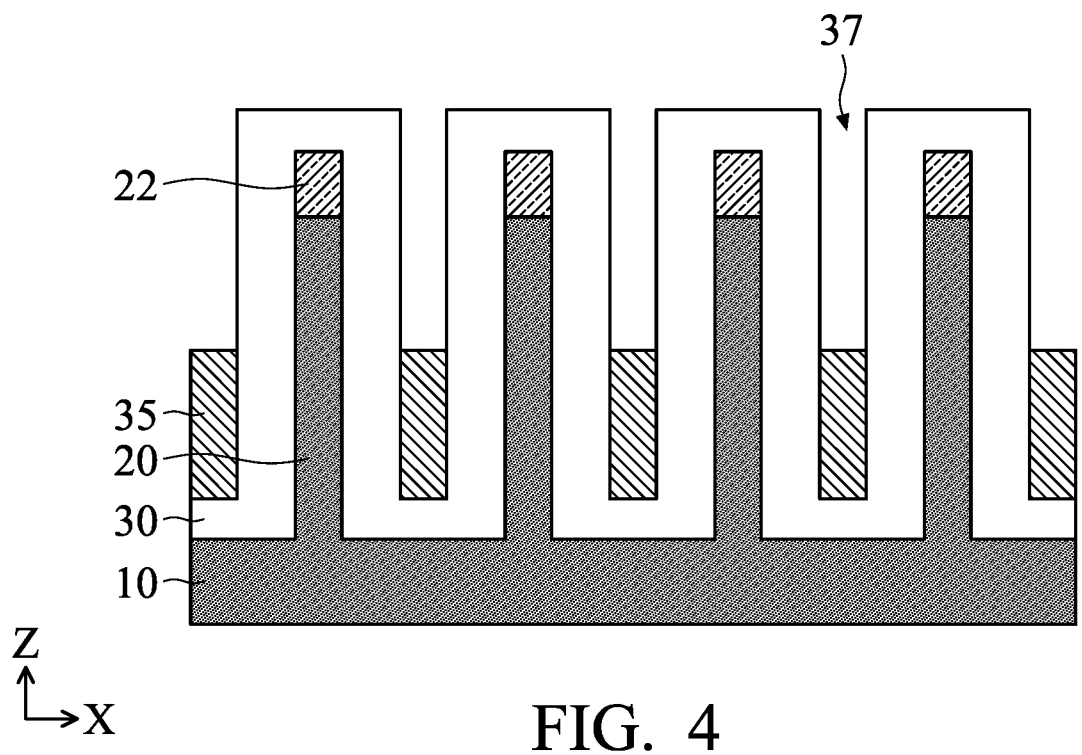
FIG. 4 shows one of the various stages of a sequential manufacturing operation of a semiconductor FET device according to an embodiment of the present disclosure.

Next, the second dielectric layer 35 is recessed down below the top of the fin structures 20 by using a suitable dry and/or wet etching operation, as shown in FIG. 4. Since the second dielectric layer 35 is made of a different material than the first dielectric layer 30, the second dielectric layer 35 is selectively etched against the first dielectric layer 30. As shown in FIG. 4, a second space 37 is formed over the recessed second dielectric layer 35. In some embodiments, the upper surface of the recessed second dielectric layer 35 has a V-shape or a U-shape.

Figure 5:
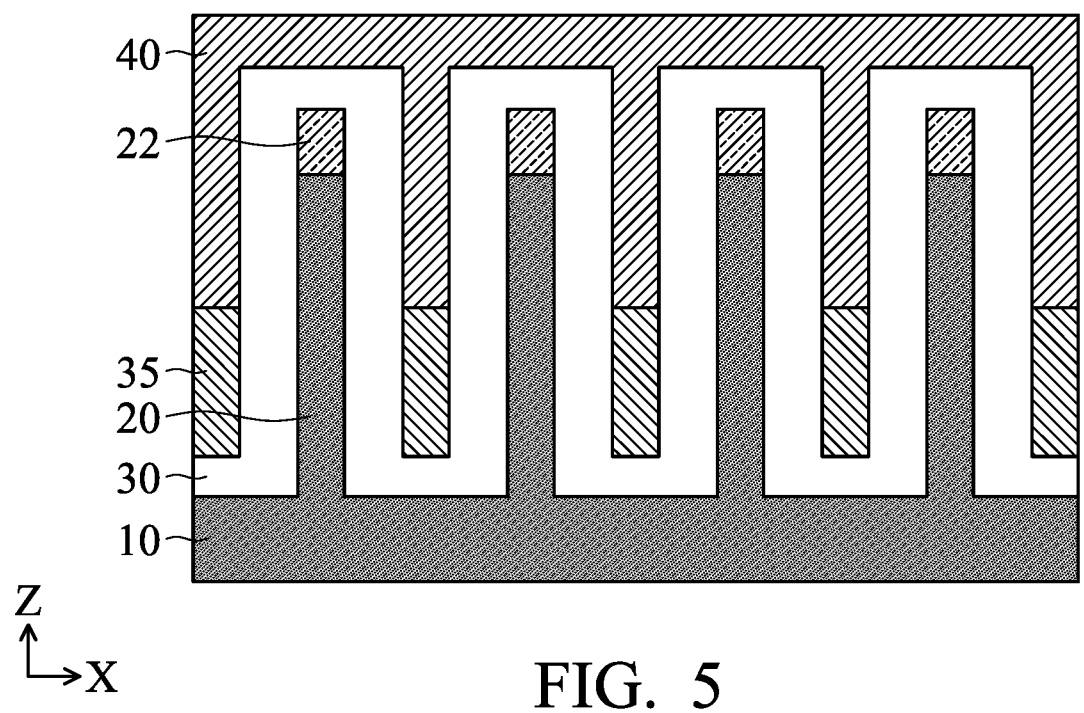
FIG. 5 shows one of the various stages of a sequential manufacturing operation of a semiconductor FET device according to an embodiment of the present disclosure.

Further, after the second dielectric layer 35 is recessed, a third dielectric layer 40 is formed over the first dielectric layer 30 and the recessed second dielectric layer 35, as shown in FIG. 5. The material of the third dielectric layer 40 is different from the materials of the first dielectric layer 30 and the second dielectric layer 35. In some embodiments, the third dielectric layer 40 includes a material having a lower etching rate than the second dielectric layer against a polysilicon etching. In some embodiments, the third dielectric layer 40 includes a high-k dielectric material. In some embodiments, the third dielectric layer 40 includes a dielectric material having a higher dielectric constant (k) than the second dielectric layer 35 and/or the first dielectric layer 30. When the upper surface of the recessed second dielectric layer 35 has a V-shape or a U-shape, the bottom of the third dielectric layer 40 has a V-shape or a U-shape.

In some embodiments, the third dielectric layer 40 includes one or more of non-doped hafnium oxide (e.g., $HfO_x$, $0<x≤2$), hafnium oxide doped with one or more other elements (e.g., HfSiO, HfSiON, HfTaO, HfTiO or HfZrO), zirconium oxide, aluminum oxide, titanium oxide, and a hafnium dioxide-alumina ($HfO_2$—$Al_2O_3$) alloy. In certain embodiments, hafnium oxide ($HfO_x$) is used as the third dielectric layer 40. The third dielectric layer can be formed by LPCVD, plasma-CVD or ALD, or any other suitable film formation method. In some embodiments, the second dielectric layer 35 is made of silicon nitride. As shown in FIG. 5, the third dielectric layer 40 fully fills the second space 37 and covers the top of the first dielectric layer 30, in some embodiments. In some embodiments, after the third dielectric layer 40 is formed, a planarization operation, such as an etch-back process or a CMP process, is performed to planarize the upper surface of the third dielectric layer 40.

Figure 6:
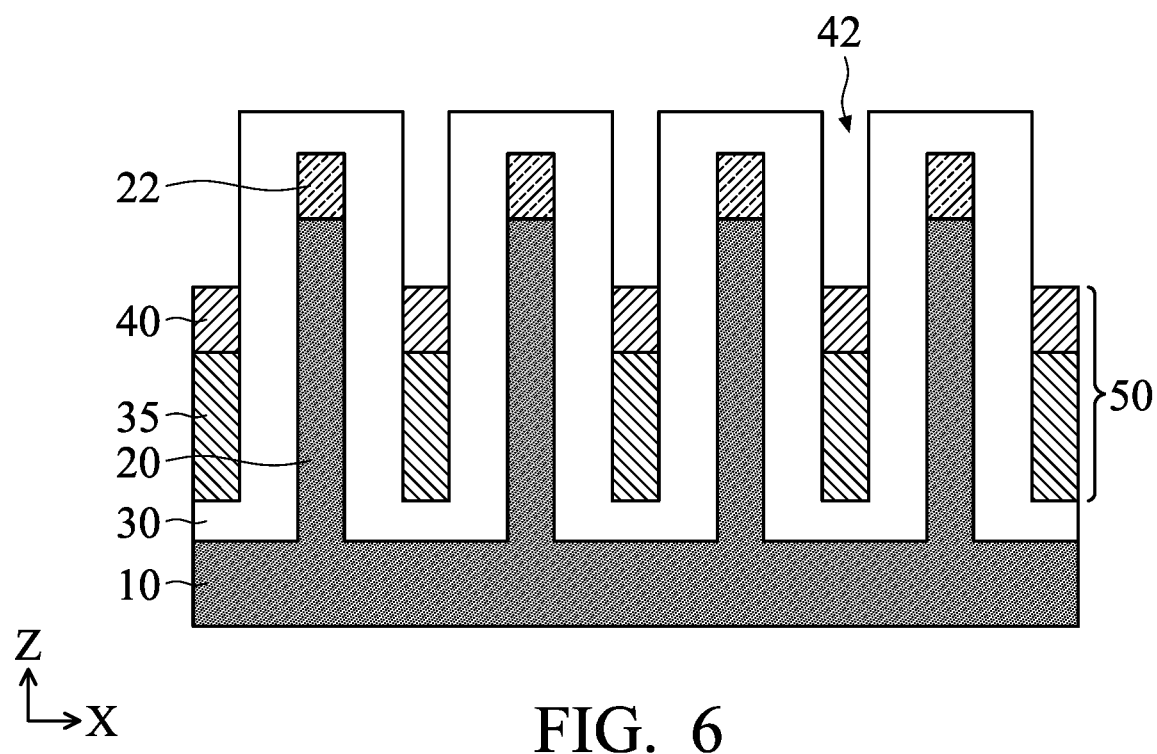
FIG. 6 shows one of the various stages of a sequential manufacturing operation of a semiconductor FET device according to an embodiment of the present disclosure.

Next, the third dielectric layer 40 is recessed down below the top of the fin structures 20 by using a suitable dry and/or wet etching operation to form a wall fin 50 (dummy dielectric fin), as shown in FIG. 6. Since the third dielectric layer 40 is made of a different material than the first dielectric layer 30, the third dielectric layer 40 is selectively etched against the first dielectric layer 30. As shown in FIG. 6, a third space 42 is formed over the wall fin 50 (recessed third dielectric layer 40). As shown in FIG. 6, the wall fin 50 includes the recessed third dielectric layer 40 formed on the recessed second dielectric layer 35, as a hybrid fin structure. In some embodiments, the upper surface of the recessed third dielectric layer 30 has a V-shape or a U-shape.

Figure 7:
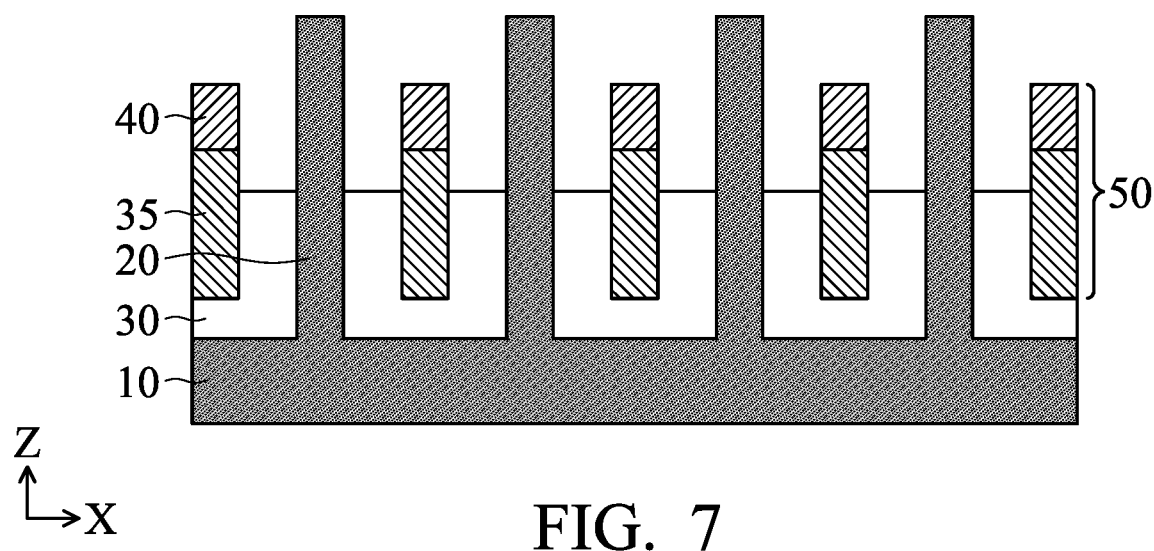
FIG. 7 shows one of the various stages of a sequential manufacturing operation of a semiconductor FET device according to an embodiment of the present disclosure.

Then, the first dielectric layer 30 is recessed down below the top of the fin structures 20 by using a suitable dry and/or wet etching operation so that an upper portion of the wall fin 50 is exposed, as shown in FIG. 7. Since the first dielectric layer 30 is made of a different material than the second dielectric layer 35 and the third dielectric layer 40, the first dielectric layer 30 is selectively etched against the second and third dielectric layers. The recessed first dielectric layer 30 functions as an isolation insulating layer (e.g., shallow trench isolation (STI)) to electrically isolation one fin structure from adjacent fin structures.

Figure 8A:
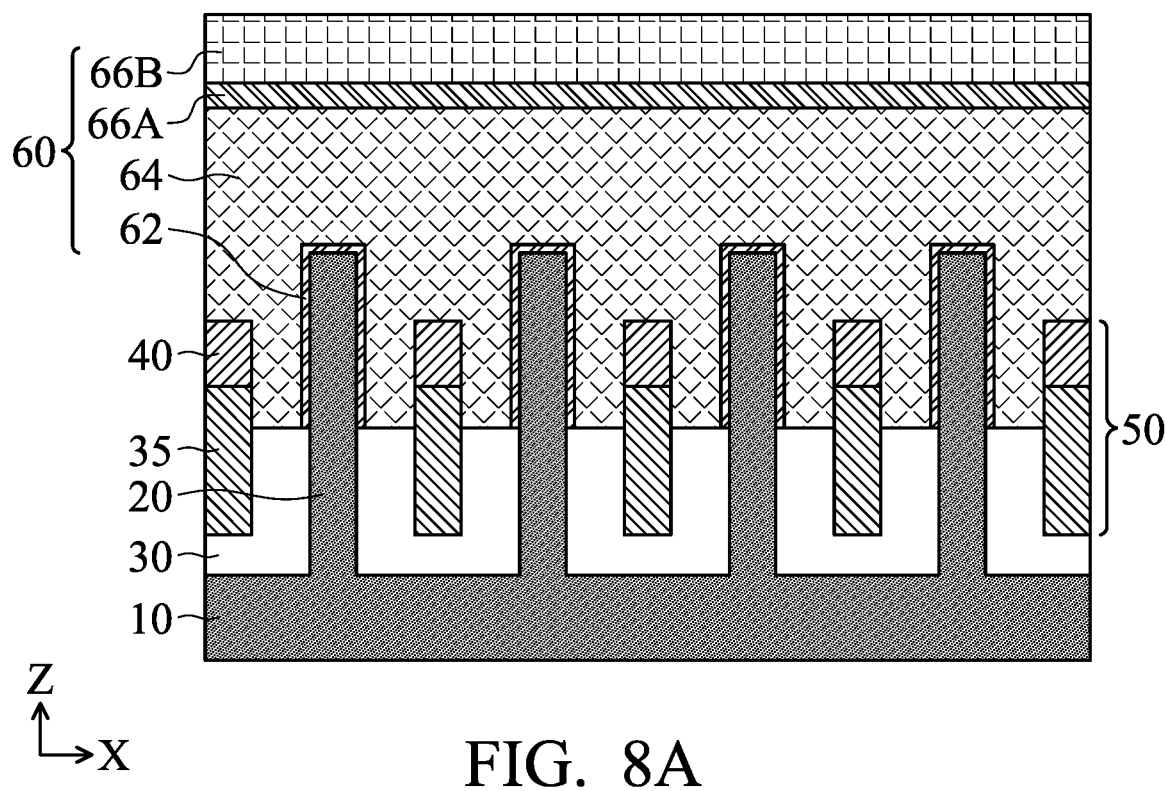
FIGS. 8A, 8B, 8C, 8D and 8E show one of the various stages of a sequential manufacturing operation of a semiconductor FET device according to an embodiment of the present disclosure.
Figure 8B:
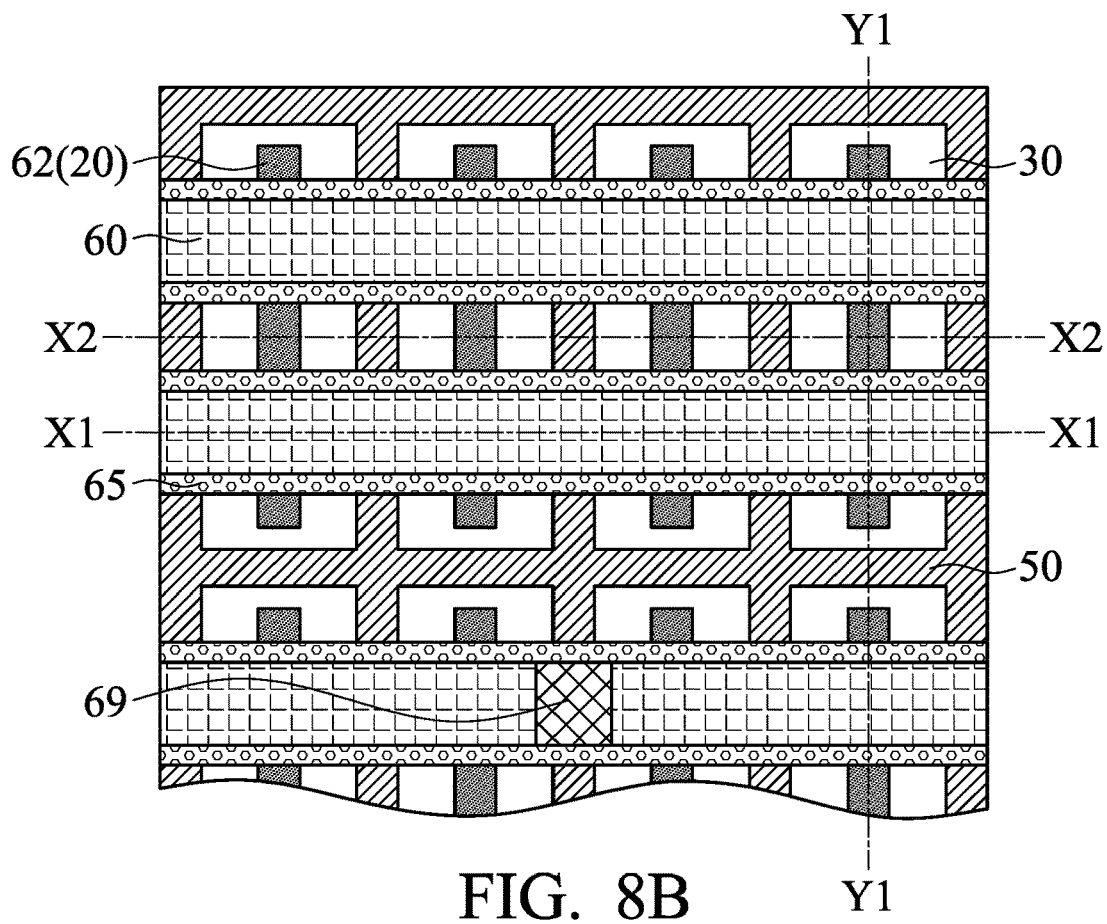
Figure 8C:
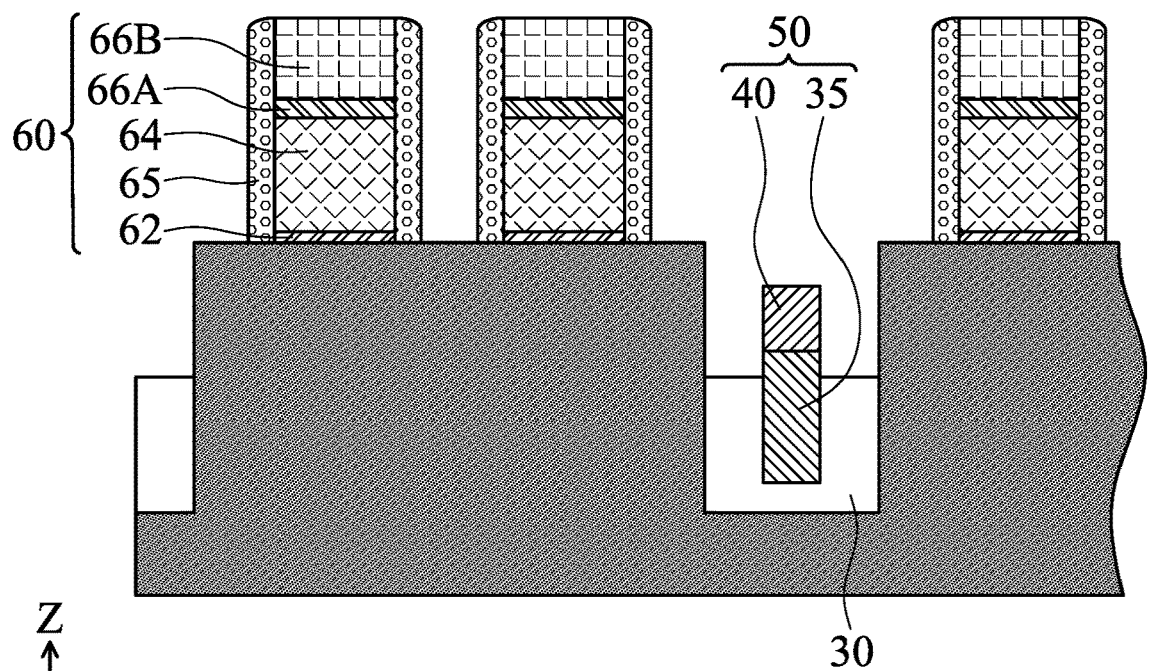

Subsequently, a sacrificial gate structure 60 is formed over channel regions of the fin structures 20 and the wall fins 50, as shown in FIGS. 8A-8C. FIG. 8B is a plan view, FIG. 8A is a cross sectional view corresponding to line X1-X1 of FIG. 8B and FIG. 8C is a cross sectional view corresponding to line Y1-Y1 of FIG. 8B. The sacrificial gate structure 60 includes a sacrificial gate dielectric layer 62 and a sacrificial gate electrode layer 64. In some embodiments, the sacrificial gate structure 60 further includes a hard mask layer over the sacrificial gate electrode layer 64. In some embodiments, the hard mask layer includes a first hard mask layer 66A and a second hard mask layer 66B.

Figure 8D:
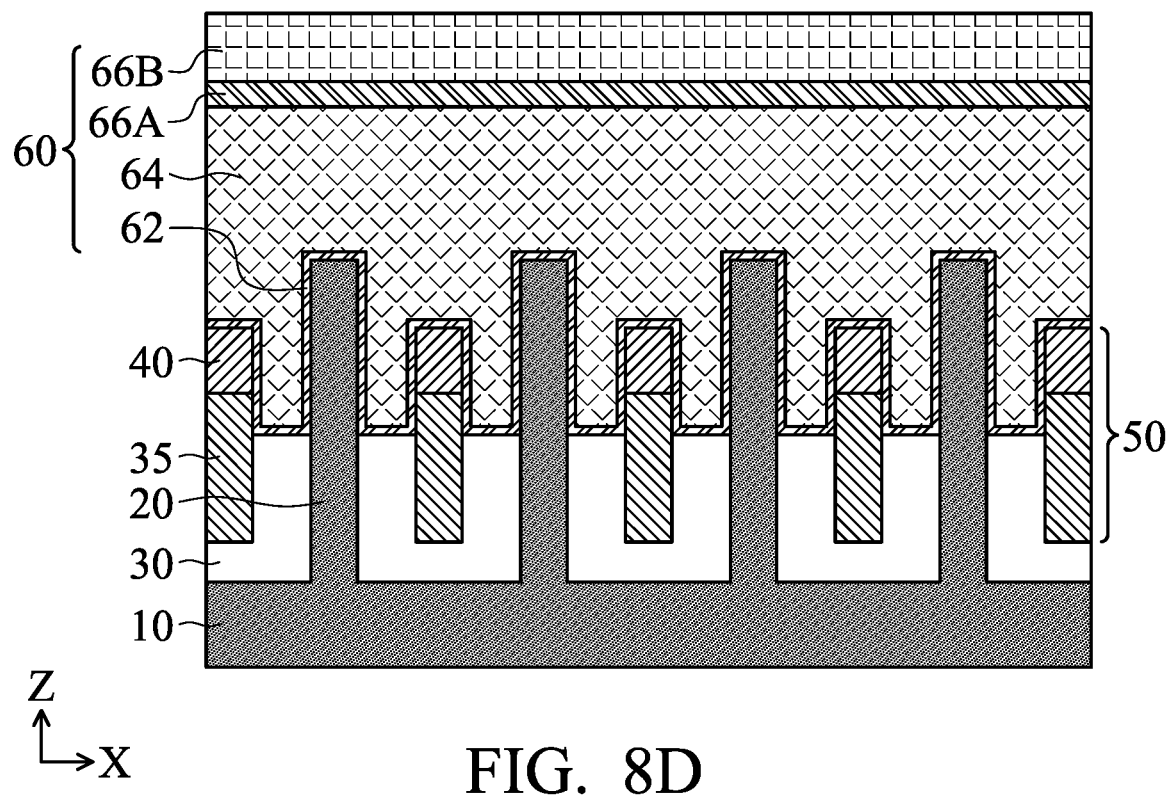

A blanket layer for the sacrificial gate dielectric layer and a blanket polysilicon layer are formed over the isolation insulating layer 30, the fin structures 20 and the wall fin structure 50, and then patterning operations are performed so as to obtain the sacrificial gate structure 60 as shown in FIGS. 8A and 8B. The patterning of the poly silicon layer is performed by using a hard mask including a silicon nitride layer as the first hard mask layer 66A and an oxide layer as the second hard mask layer 66B in some embodiments. In other embodiments, the first hard mask layer 66A may be silicon oxide and the second hard mask layer 66B may be silicon nitride. The sacrificial gate dielectric layer 62 is formed by oxidation in some embodiments. In other embodiments, the sacrificial gate dielectric layer 62 is formed by CVD, PVD, ALD, e-beam evaporation, or other suitable film deposition process. In such a case, as shown in FIG. 8D, the sacrificial gate dielectric layer 62 is also formed on the isolation insulating layer 30 and the wall fin structure 50 and is formed between the sidewall spacers 65 and the fin structure 20. In some embodiments, a thickness of the sacrificial gate dielectric layer 62 is in a range of about 1 nm to about 5 nm.

As shown in FIG. 8B, two sacrificial gate structures 60 extending in the X direction are disposed adjacent to each other in the Y direction. However, the number of the sacrificial gate structures is not limited to two. The numbers may be one, three, four or five or more. In addition, one or more dummy gate structures may be disposed adjacent to both sides of the sacrificial gate structures 60 to improve pattern fidelity in patterning processes. The width of the sacrificial gate structure 60 is in a range of about 5 nm to about 40 nm in some embodiments, and may be in a range of about 7 nm to about 15 nm in certain embodiments.

As shown in FIG. 8B, the wall fin structure 50 surrounds the fin structure in some embodiments. Depending on the space between the fin structures 20 along the Y direction, the width of the wall fin structure 50 along the Y direction is smaller, equal to or larger than the width of the wall fin structure 50 along the X direction. When the space between the fin structures 20 along the Y direction is small, no wall fin structure is formed between the ends of the fin structures, in some embodiments. When the space between the fin structures 20 along the Y direction is large, a wall fin structure without one of the second and third dielectric layers is formed, or no wall fin structure is formed between the ends of the fin structures, in some embodiments. In some embodiments, a dummy gate structure is formed over the space between the fin structures 20 along the Y direction.

Further, as shown in FIGS. 8B and 8C, gate sidewall spacers 65 are formed on side faces of the sacrificial gate structures 60. An insulating material layer for the gate sidewall spacers 65 is formed over the sacrificial gate structure 60. The insulating material layer is deposited in a conformal manner so that it is formed to have substantially equal thicknesses on vertical surfaces, such as the sidewalls, horizontal surfaces, and the top of the sacrificial gate structure 60, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, horizontal portions of the insulating material layer are removed by anisotropic etching, thereby forming the gate sidewall spacers 65. In some embodiments, the gate sidewall spacers 65 include two to four layers of different insulating materials.

Figure 8E:
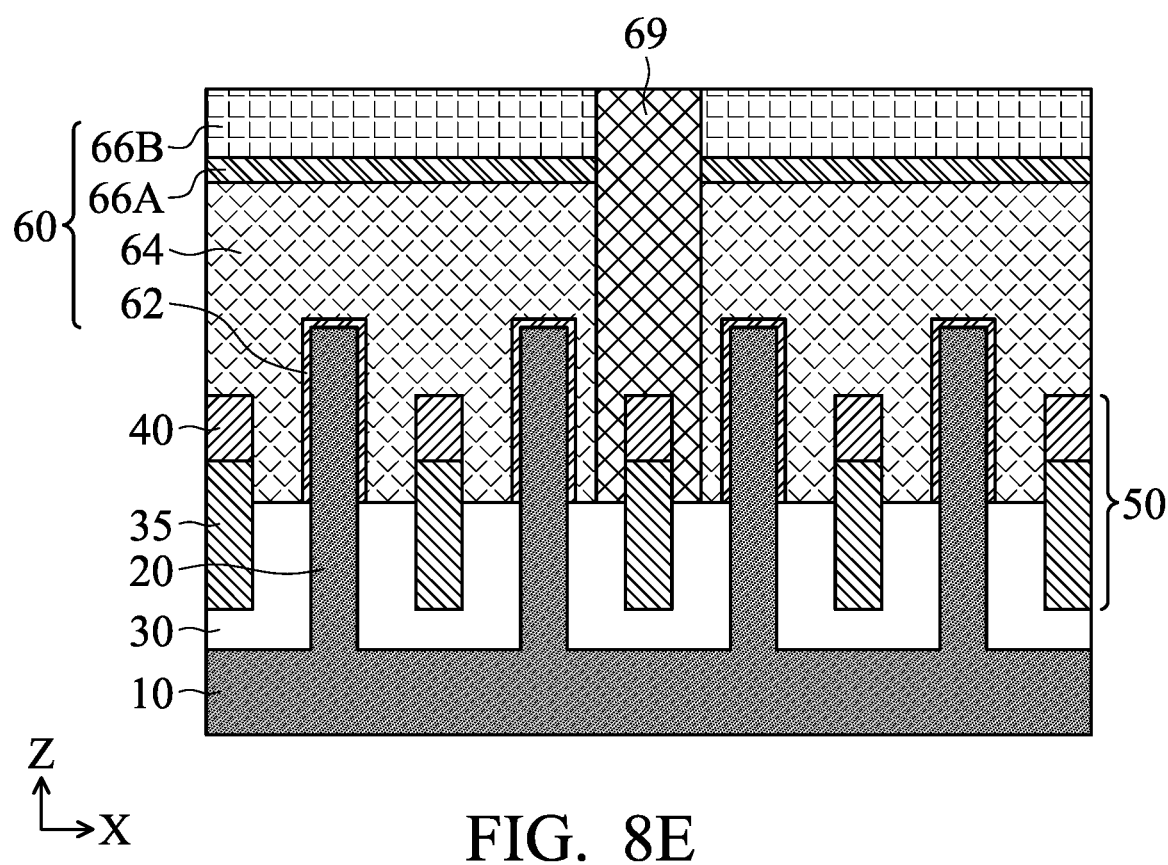

Further, in some embodiments, as shown in FIG. 8E, the sacrificial gate structure 60 is cut into multiple pieces of sacrificial gate structures. An insulating separation plug 69 is formed between adjacent multiple pieces of sacrificial gate structures. In some embodiments, as shown in FIG. 8E, the separation plug 69 covers the wall fin structure 50. In other embodiments, at least the third dielectric layer 40 is removed and then the separation plug 69 is formed. In certain embodiments, the third dielectric layer 40 and at least a part of the second dielectric layer 35 are removed and then the separation plug 69 is formed. The separation plug 69 includes one or more layers of dielectric materials, such as silicon oxide, silicon oxynitride, silicon nitride, SiOC, SiCN or SiOCN, formed by LPCVD, plasma-CVD or atomic layer deposition (ALD), or any other suitable film formation method.

Figure 9:
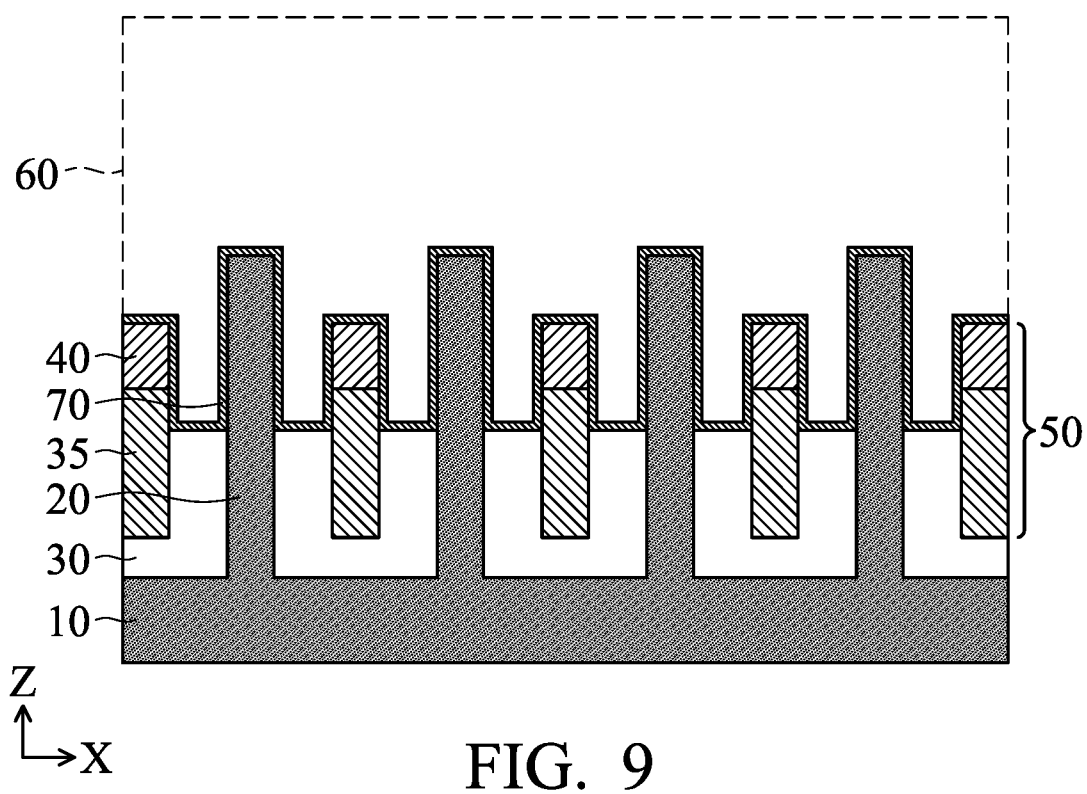
FIG. 9 shows one of the various stages of a sequential manufacturing operation of a semiconductor FET device according to an embodiment of the present disclosure.

Subsequently, as shown in FIG. 9, a fin liner layer 70 is formed over the source/drain regions of the fin structures 20 and the wall fin structures 50. FIG. 9 is a cross sectional view corresponding to line X2-X2 of FIG. 8B.

The fin liner layer 70 includes one or more layers of insulating materials such as silicon oxide, silicon oxynitride, silicon nitride, SiOC, SiCN or SiOCN, formed by LPCVD, plasma-CVD or atomic layer deposition (ALD), or any other suitable film formation method. In certain embodiments, silicon nitride is used as the fin liner layer 70. In some embodiments, the fin liner layer 70 has a thickness in a range from about 5 nm to about 20 nm.

Figure 10:
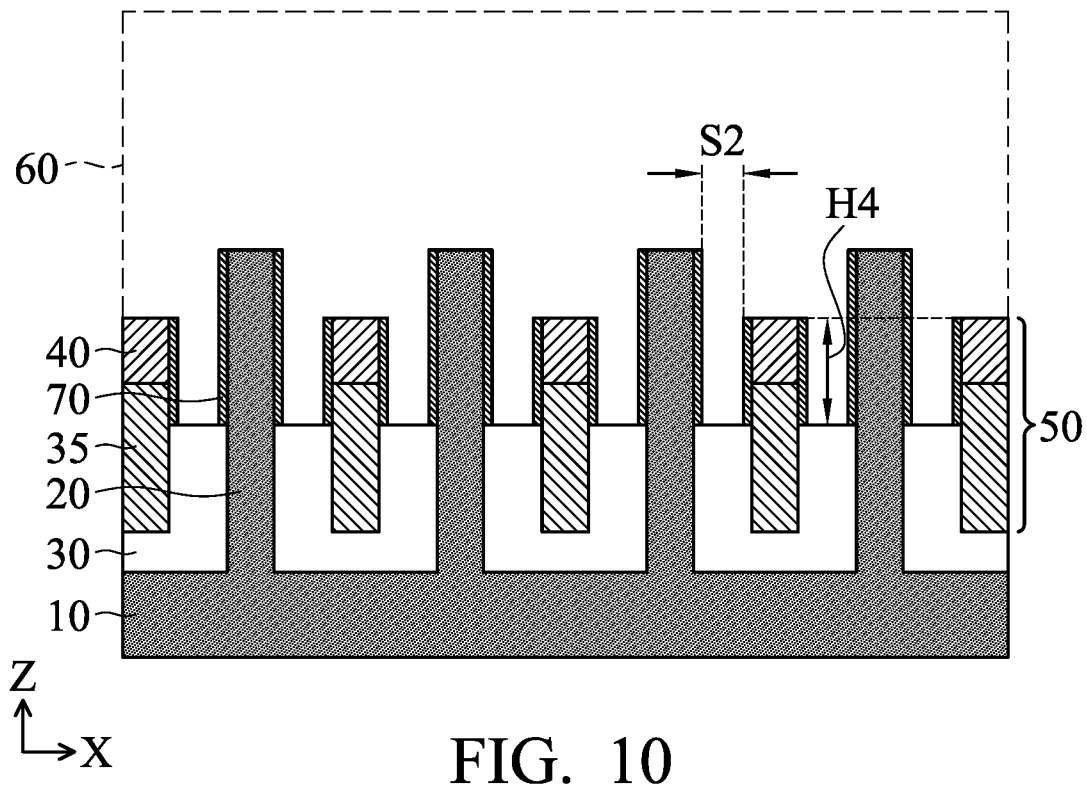
FIG. 10 shows one of the various stages of a sequential manufacturing operation of a semiconductor FET device according to an embodiment of the present disclosure.

Then, as shown in FIG. 10, horizontal portion of the fin liner layer 70 is removed by anisotropic etching. By this etching, the top of the source/drain region of the fin structure 20 and the top of the wall fin structure 50 are exposed and the fin liner layer 70 remains on side faces of the fin structure 20 as fin sidewalls.

Figure 11:
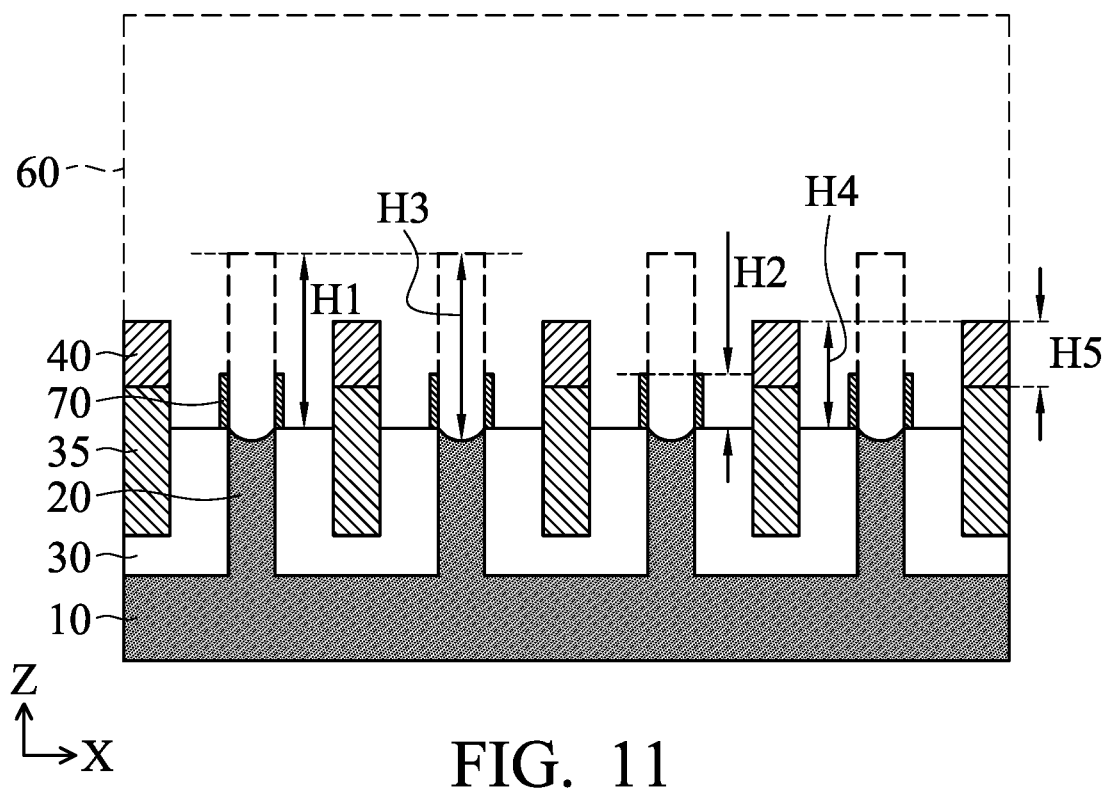
FIG. 11 shows one of the various stages of a sequential manufacturing operation of a semiconductor FET device according to an embodiment of the present disclosure.

Further, as shown in FIG. 11, the source/drain region of the fin structure 20 is recessed by using a suitable etching operation. During the etching operation, the fin sidewalls 70 are also recessed below the top of the wall fin structure 50 as shown in FIG. 11. Since the upper portion (recessed third dielectric layer 40 made of e.g., hafnium oxide) of the wall fin structure 50 is made of different material than the fin sidewalls 70 (e.g., silicon nitride), the wall fin structure 50 is not recessed. Although the lower portion (recessed second dielectric layer 35) is made of the same material as the fin sidewalls 70 in some embodiments, since the recess etching is anisotropic etching, the recessed second dielectric layer 35 is not substantially etched.

Figure 12A:
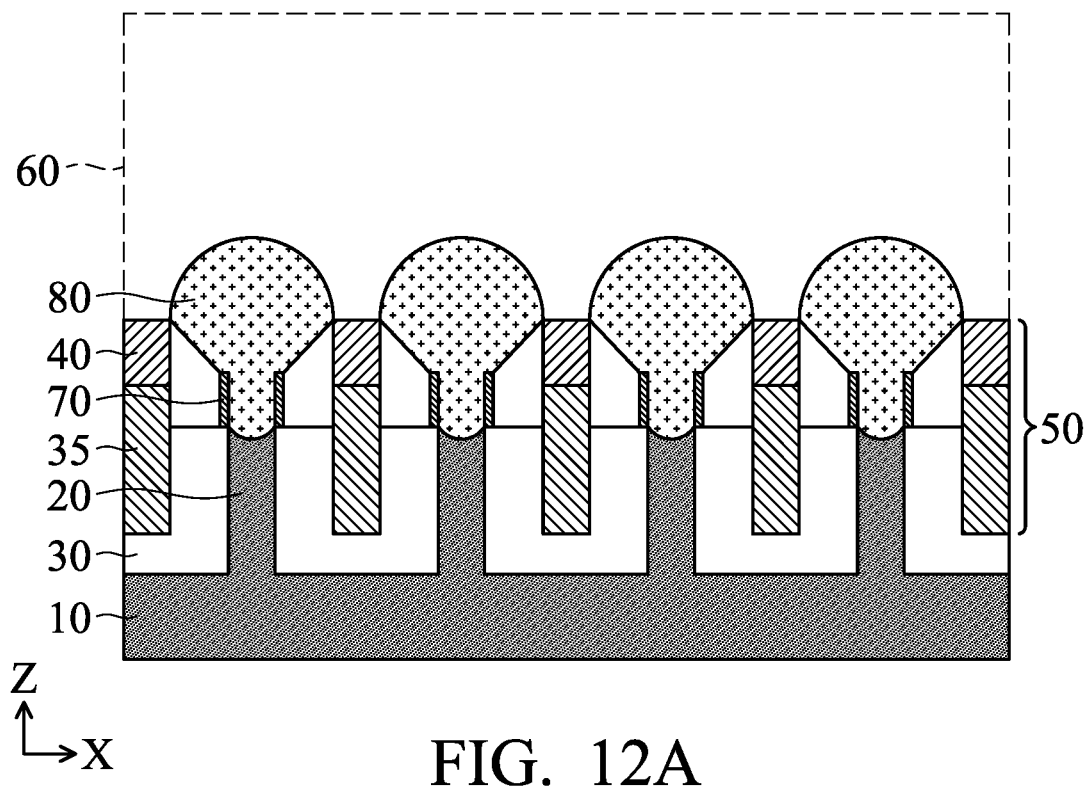
FIGS. 12A and 12B show one of the various stages of a sequential manufacturing operation of a semiconductor FET device according to an embodiment of the present disclosure.
Figure 12B:
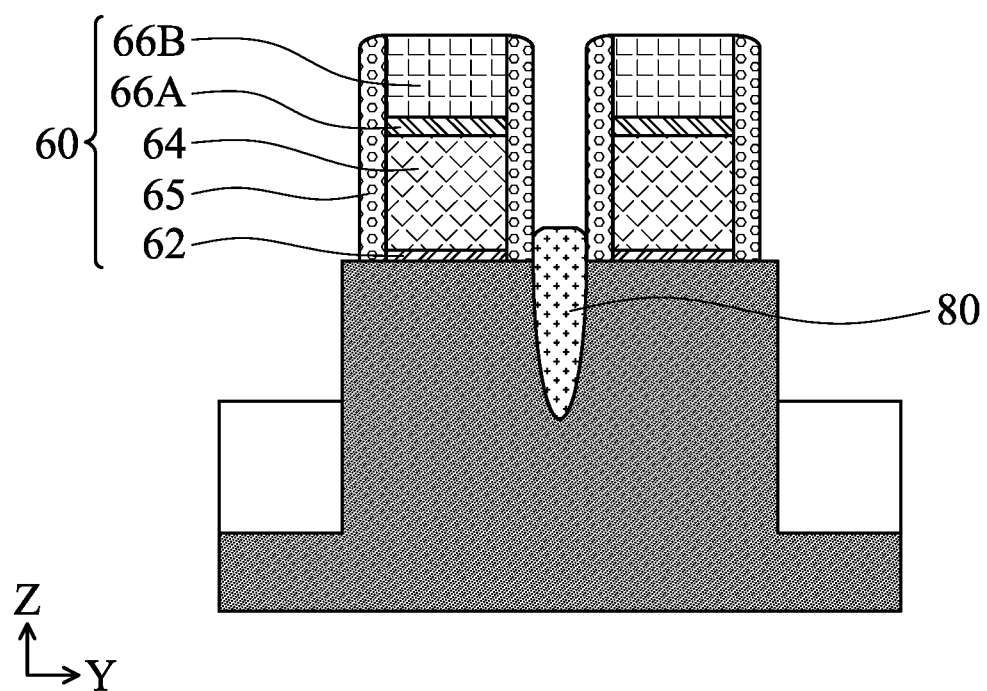

Subsequently, one or more source/drain epitaxial layers 80 are formed over the recessed fin structure 20 as shown in FIGS. 12A and 12B. FIG. 12B is a cross sectional view corresponding to line Y1-Y1 of FIG. 8B.

In some embodiments, the source/drain epitaxial layer 80 includes one or more of SiP, SiAs, SiCP, SiPAs and SiC for an n-type FET, and SiGe, GeSn and SiGeSn for a p-type FET. For the p-type FET, the source/drain epitaxial layer 80 is doped with B (boron) in some embodiments. In some embodiments, the source/drain epitaxial layer includes multiple layers. In some embodiments, the source/drain epitaxial layer 80 is epitaxially-grown by an LPCVD process, molecular beam epitaxy, atomic layer deposition or any other suitable method. The LPCVD process is performed at a temperature of about 400 to 800° C. and under a pressure of about 1 to 200 Torr, using silicon source gas such as $SiH_4$, $Si_2H_6$, or $Si_3H_8$; germanium source gas such as $GeH_4$, or $Ge_2H_6$; carbon source gas such as $CH_4$ or $SiH_3CH$ and phosphorus source gas such as $PH_3$.

In FIG. 11, H1 is a height of the source/drain region of the fin structure 20 from the upper surface of the isolation insulating layer 30 before the recess etching, H2 is a height of the fin sidewalls 70 from the upper surface of the isolation insulating layer 30 after the recess etching, and H3 is a distance between the top of the source/drain region of the fin structure 20 before the recess etching to the top of the source/drain region of the fin structure 20 after the recess etching. H4 is a height of the wall fin structure 50 from the upper surface of the isolation insulating layer 30, and H5 is a height of the recessed third dielectric layer 40 of the wall fin structure 50. Further, as shown in FIG. 10, S2 is a space between the fin structure 20 with the fin liner layer 70 and the wall fin structure 50 with the fin liner layer 70.

In some embodiments, the ratio H2/H1 is in a range from about 0.13 to 0.17, depending on the design and/or process requirement of the semiconductor device. In some embodiments, the ratio H2/H1 is in a range from about 0.13 to 0.144 (first case), in a range from about 0.144 to 0.156 (second case), or in a range from about 0.156 to 0.17 (third case). In some embodiments, the ratio H3/H1 is in a range from about 0.88 to 1.0, depending on the design and/or process requirement of the semiconductor device. In some embodiments, the ratio H3/H1 is in a range from about 0.88 to 0.92 (the first case), in a range from about 0.92 to 0.96 (the second case), or in a range from about 0.96 to 1.0 (third case).

When H2/H1 and/or H3/H1 exceed the upper limit, the source/drain epitaxial layer 80 formed on the recessed fin structure has a relatively low volume and when H2/H1 and/or H3/H1 are below the lower limit, the growth directions of the source/drain epitaxial layer is difficult to be controlled and/or adjacent source/drain epitaxial layer 80 may be merged.

In some embodiments, the ratio H4/H1 is in a range from about 0.6 to about 0.9 and is in a range from about 0.7 to 0.8 in other embodiments. When H4/H1 exceeds the upper limit, the volume of the source drain epitaxial layer 80 becomes smaller, and when H4/H1 is below the lower limit, adjacent source/drain epitaxial layer 80 may be merged.

In some embodiments, the ratio H4/S2 is in a range from about 1.5 to about 4.5 and is in a range from about 2.0 to 3.5 in other embodiments. When H4/S2 exceeds the upper limit, the volume of the source drain epitaxial layer 80 becomes smaller, and when H4/H1 is below the lower limit, adjacent source/drain epitaxial layer 80 may be merged.

It is noted that by controlling the height H4 of the wall fin structure, the height H2 of the fin sidewall can be controlled. As explained below, the height H2 affects the volume of the source/drain epitaxial layer 80. In other words, by controlling the wall fin height H4 (e.g., the thickness of the recessed second and/or third dielectric layer), the volume of the source/drain epitaxial layer 80 can be controlled.

Then, one or more interlayer dielectric (ILD) layers 90 is formed over the source/drain epitaxial layer 80 and the sacrificial gate structure 60. The materials for the ILD layer 90 include compounds comprising Si, O, C and/or H, such as silicon oxide, SiCOH and SiOC. Organic materials, such as polymers, may be used for the ILD layer 90. After the ILD layer 90 is formed, a planarization operation, such as CMP, is performed, so that the top portion of the sacrificial gate electrode layer 64 is exposed. In some embodiments, before the ILD layer 90 is formed, a contact etch stop layer, such as a silicon nitride layer or a silicon oxynitride layer, is formed.

Then, the sacrificial gate electrode layer 64 and the sacrificial gate dielectric layer 62 are removed, thereby forming a gate space. The sacrificial gate structures can be removed using plasma dry etching and/or wet etching. When the sacrificial gate electrode layer 64 is polysilicon and the ILD layer 90 is silicon oxide, a wet etchant such as a TMAH solution can be used to selectively remove the sacrificial gate electrode layer 64. The sacrificial gate dielectric layer 62 is thereafter removed using plasma dry etching and/or wet etching.

Figure 13A:
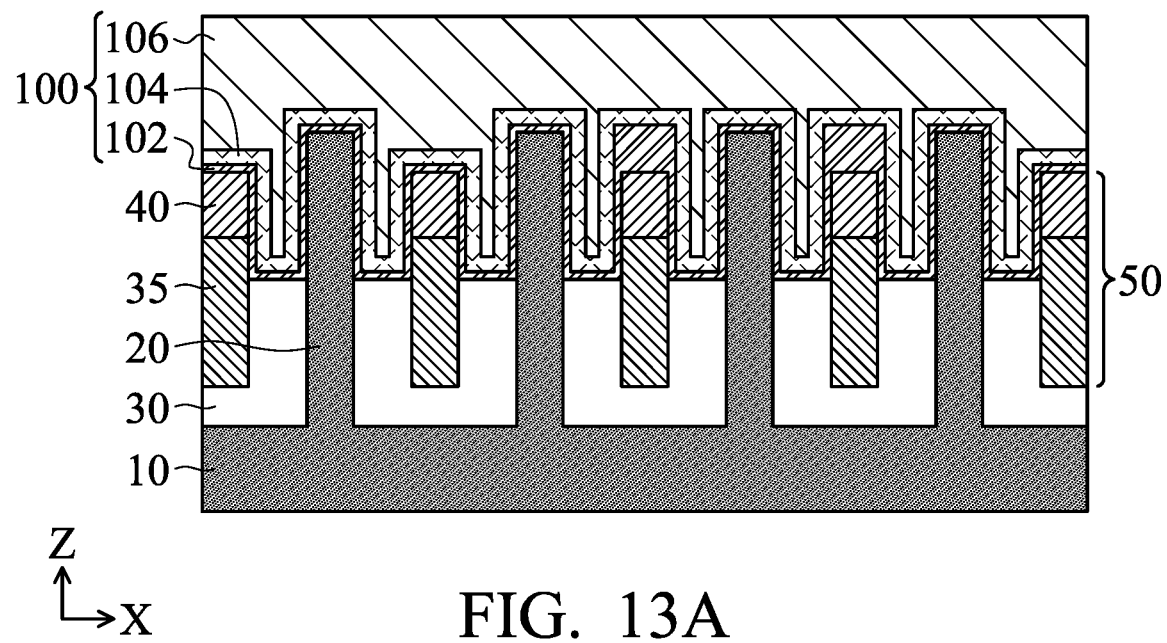
FIGS. 13A and 13B show one of the various stages of a sequential manufacturing operation of a semiconductor FET device according to an embodiment of the present disclosure.
Figure 13B:
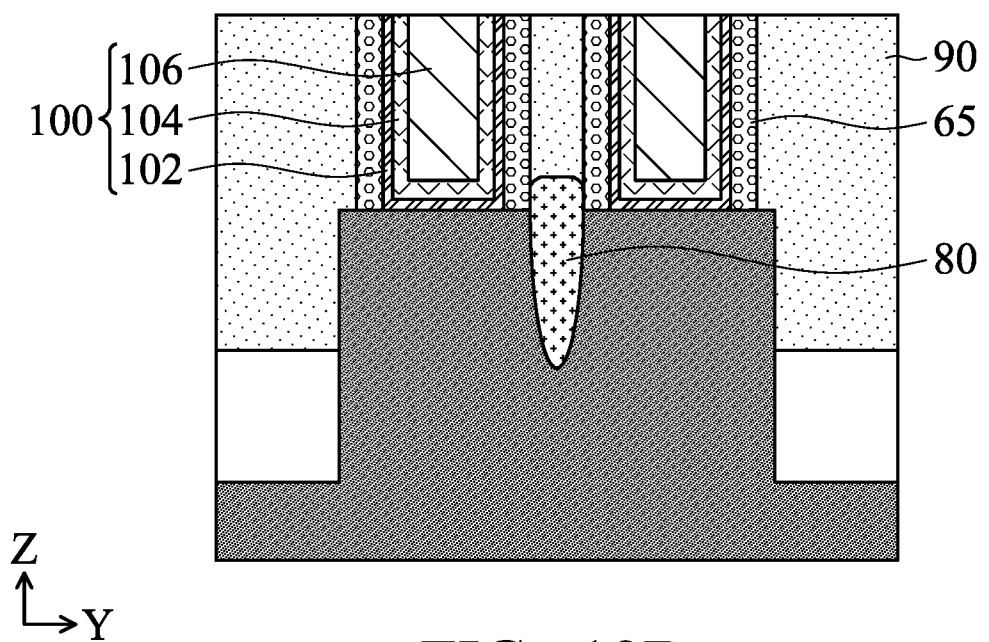
Figures 15A, 15B:
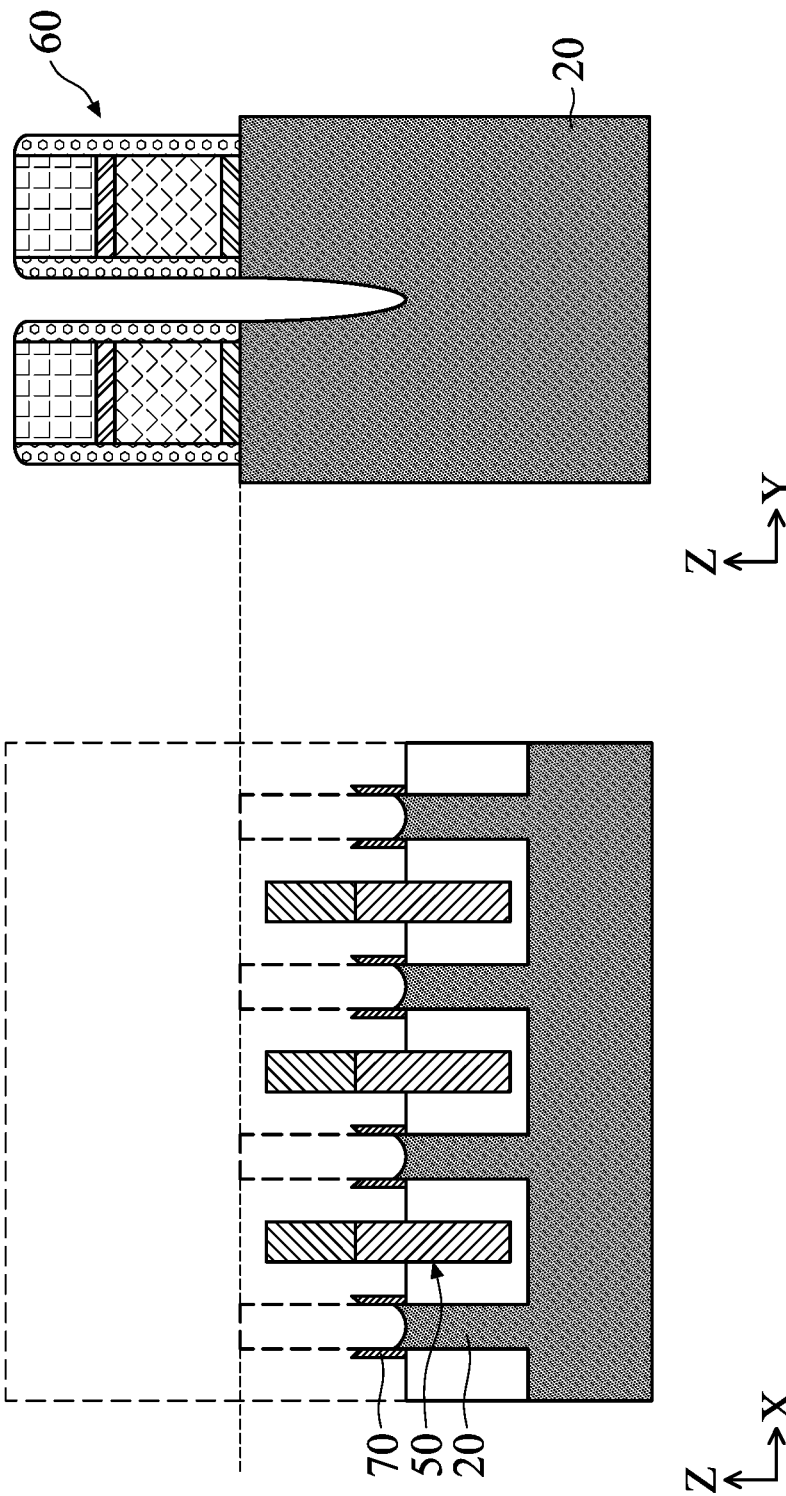
FIGS. 15A and 15B show one of the various stages of a sequential manufacturing operation of a semiconductor FET device according to another embodiment of the present disclosure.

After the sacrificial gate electrode layer 64 and the sacrificial gate dielectric layer 62 are removed, a metal gate structure 100 is formed in the gate space, as shown in FIGS. 13A and 13B. FIG. 13B is a cross sectional view corresponding to line Y1-Y1 of FIG. 8B. The metal gate structure 100 includes a gate dielectric layer 102 and a metal gate electrode layer 106. In some embodiments, the gate dielectric layer 102 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer formed between the channel layer and the dielectric material, by using chemical oxidation. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layer. The thickness of the gate dielectric layer 102 is in a range from about 1 nm to about 10 nm in one embodiment.

Subsequently, a metal gate electrode layer 106 is formed over the gate dielectric layer 102. The gate electrode layer 106 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 106 may be formed by CVD, ALD, electro-plating, or other suitable method. The materials for the gate dielectric layer 102 and the gate electrode layer 106 are also deposited over the upper surface of the ILD layer 90. The material for the gate electrode layer formed over the ILD layer 90 is then planarized by using, for example, CMP, until the top surface of the ILD layer 90 is revealed.

In some embodiments of the present disclosure, one or more work function adjustment layers 104 are interposed between the gate dielectric layer 102 and the gate electrode layer 106, as shown in FIGS. 13A and 13B. The work function adjustment layers 104 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer 104. The work function adjustment layer 104 may be formed by ALD, PVD, CVD, e-beam evaporation, or other suitable process. Further, the work function adjustment layer 104 may be formed separately for the n-channel FET and the p-channel FET which may use different metal layers.

In some embodiments, after the planarization operation, the metal gate structure 100 is recessed and a cap insulating layer (not shown) is formed over the recessed gate electrode layer. The cap insulating layer includes one or more layers of a silicon nitride-based material, such as SiN. The cap insulating layer can be formed by depositing an insulating material followed by a planarization operation.

It is understood that the FET undergoes further CMOS processes to form various features such as contacts/vias, interconnect metal layers, dielectric layers, passivation layers, etc.

FIGS. 14A-16B and FIGS. 17A-19B are comparisons among the cases with different dimensions with respect to H1, H2 and H3.

FIGS. 14A and 14B and FIGS. 17A and 17B correspond to the first case above, where the ratio H2/H1 is in a range from about 0.13 to 0.144 (first case) and the ratio H3/H1 is in a range from about 0.88 to 0.92. FIGS. 15A and 15B and FIGS. 18A and 18B correspond to the second case above, where the H2/H1 is in a range from about 0.144 to 0.156, and the ratio H3/H1 is in a range from about 0.92 to 0.96. FIGS. 16A and 16B and FIGS. 19A and 19B correspond to the third case above, where the H2/H1 is in a range from about 0.156 to 0.17, and the ratio H3/H1 is in a range from about 0.96 to 1.0.

Figures 17A, 17B:
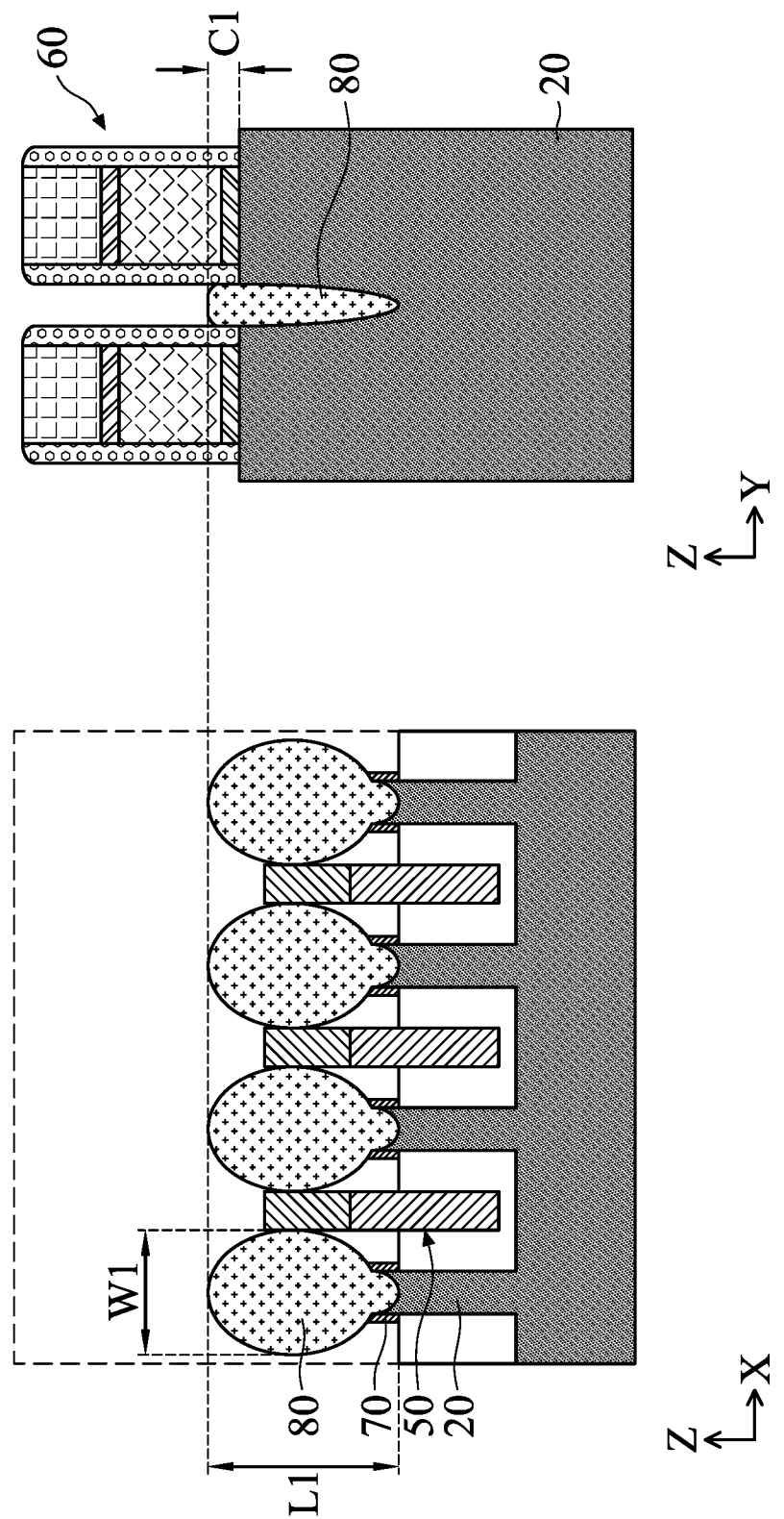
FIGS. 17A and 17B show one of the various stages of a sequential manufacturing operation of a semiconductor FET device according to an embodiment of the present disclosure.

In the first case, a cross sectional shape of the source/drain epitaxial layer 80 is substantially entirely circular (e.g., oval) as shown in FIG. 17A, and has a largest volume among the three cases. The protruding amount C1, which is a distance from the top of the fin structure 20 (channel region) to the top of the source/drain epitaxial layer, is in a range from about 1 nm to about 5 nm, in some embodiments. The width W1 and the height L1 of the source/drain epitaxial layer 80 is the largest among the three cases.

Figure 18B:
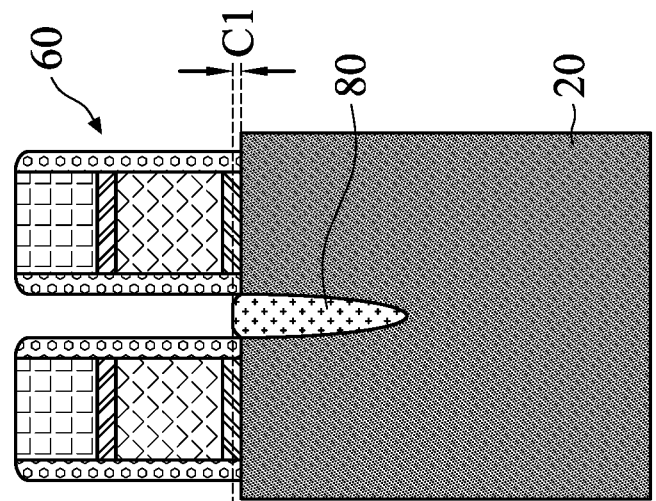
FIGS. 18A and 18B show one of the various stages of a sequential manufacturing operation of a semiconductor FET device according to another embodiment of the present disclosure.
Figure 18A:
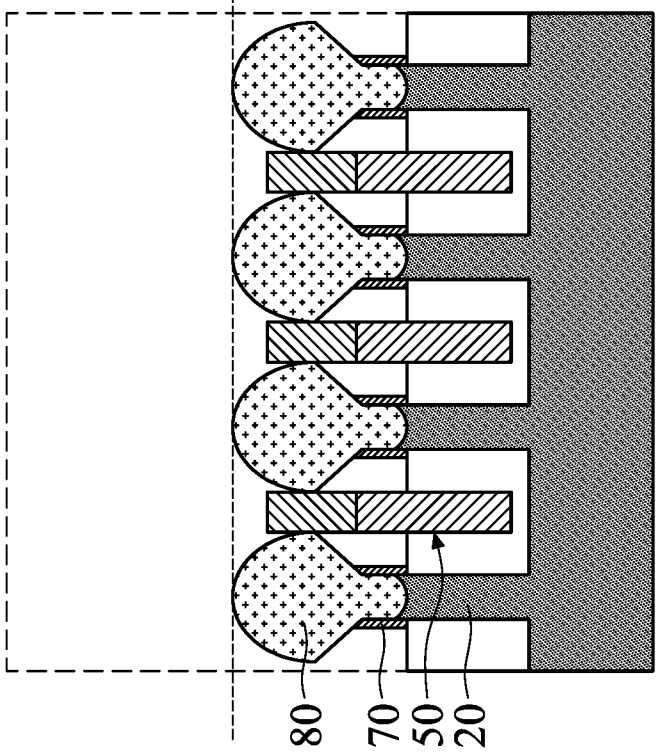

In the second case, a cross sectional shape of the source/drain epitaxial layer 80 has an half oval upper shape and a half diamond lower shape as shown in FIG. 18A. The protruding amount C1 is in a range from about ±1 nm, in some embodiments. The negative value of C1 means that the top of the source/drain epitaxial layer is below the top of the fin structure 20 (channel region).

Figure 19B:
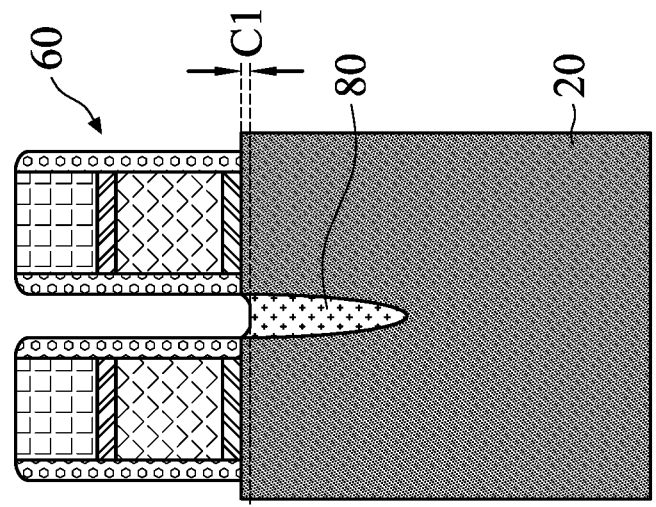
FIGS. 19A and 19B show one of the various stages of a sequential manufacturing operation of a semiconductor FET device according to another embodiment of the present disclosure.
Figure 19A:
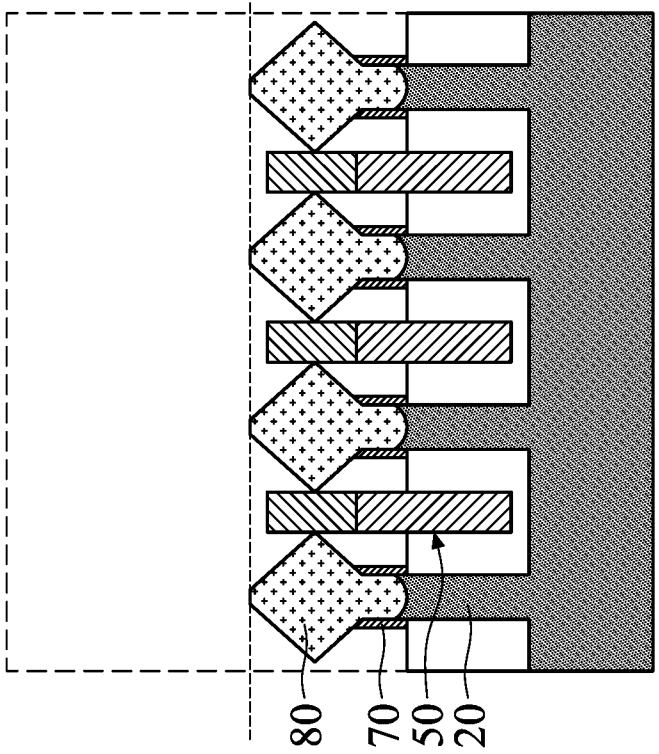

In the third case, a cross sectional shape of the source/drain epitaxial layer 80 is substantially diamond shaped as shown in FIG. 19A, and has a smallest volume among the three cases. The protruding amount C1 is in a range from about −5 nm to about −1 nm, in some embodiments.

Figure 20A:
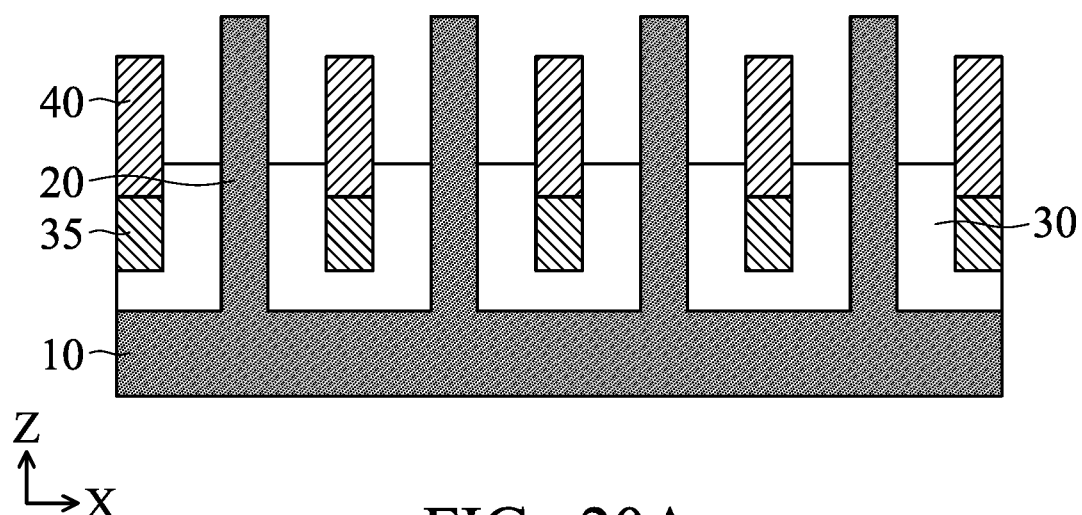
FIGS. 20A and 20B show one of the various stages of a sequential manufacturing operation of a semiconductor FET device according to other embodiments of the present disclosure.
Figure 20B:
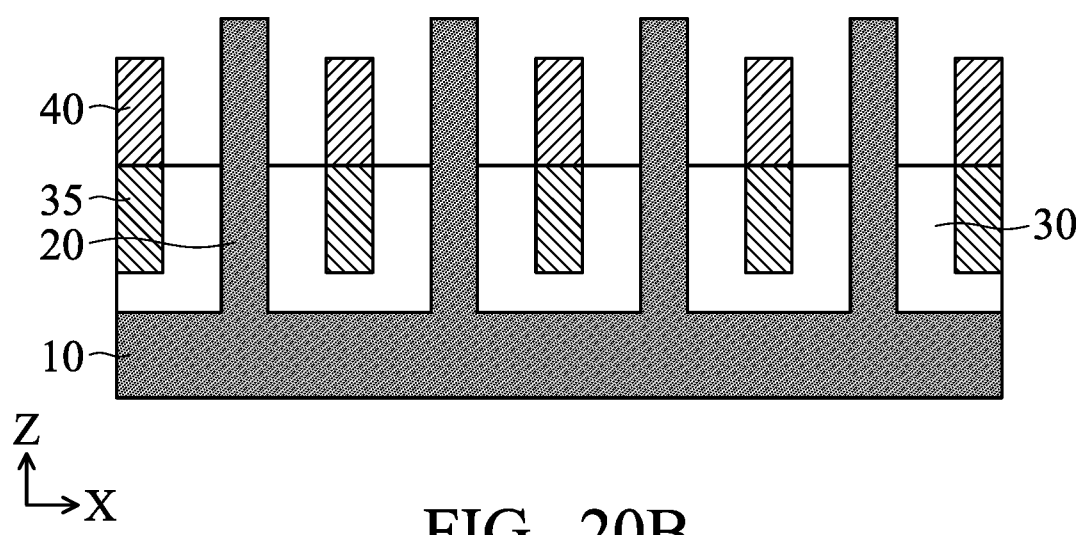

In some embodiments, an interface between the recessed second dielectric layer 35 and the recessed third dielectric layer 40 in the wall fin structure is located above the upper surface of the recessed first dielectric layer (isolation insulating layer) 30. In other embodiments, as shown in FIG. 20A, the interface between the recessed second dielectric layer 35 and the recessed third dielectric layer 40 in the wall fin structure is below the upper surface of the isolation insulating layer 30. In certain embodiments, as shown in FIG. 20B, the interface between the recessed second dielectric layer 35 and the recessed third dielectric layer 40 in the wall fin structure is substantially the same height (±2 nm) as the upper surface of the recessed first dielectric layer (isolation insulating layer) 30. When the recessed third dielectric layer 40 extends too far above the upper surface of the first dielectric layer 30, the recessed third dielectric layer 40 may bend. When the recessed second dielectric layer is fully embedded in the isolation insulating layer 30, the etching of the liner layer 70 does not affect the wall fin structure.

According to the embodiments of the present disclosure, by employing a hybrid wall fin structure having at least two layers made of different material, it is easier to adjust the height of the wall fin structure. Further, by using a high-k dielectric material for the third dielectric layer, it is possible to protect the wall fin structure during the fin liner etching and/or fin recess etching. By adjusting the height of the wall fin structure, the volume and/or shape of the source/drain epitaxial layer can be controlled.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first dielectric layer formed over semiconductor fins disposed over a semiconductor substrate, a second dielectric layer is formed over the first dielectric layer, the second dielectric layer is recessed below a top of each of the semiconductor fins, a third dielectric layer is formed over the recessed second dielectric layer, and the third dielectric layer is recessed below the top of each of the semiconductor fins, thereby forming a wall fin disposed between the semiconductor fins. The wall fin includes the recessed third dielectric layer and the recessed second dielectric layer disposed under the recessed third dielectric layer. The first dielectric layer is recessed below a top of the wall fin, a fin liner layer is formed over an upper portion of each of the semiconductor fins and an upper portion of the wall fin, which protrude from the recessed first dielectric layer, the fin liner layer is recessed and the semiconductor fins are recessed, and source/drain epitaxial layers are formed over the recessed semiconductor fins, respectively. The source/drain epitaxial layers are separated by the wall fin from each other. In one or more of the foregoing or the following embodiments, the first dielectric layer, the second dielectric layer and the third dielectric layer are made of different dielectric materials from each other. In one or more of the foregoing or the following embodiments, the third dielectric layer includes hafnium oxide. In one or more of the foregoing or the following embodiments, the second dielectric layer includes silicon nitride. In one or more of the foregoing or the following embodiments, the first dielectric layer includes silicon oxide. In one or more of the foregoing or the following embodiments, in the etching the fin liner layer, a part of the fin liner layer formed over the upper portion of each of the semiconductor fins remains. In one or more of the foregoing or the following embodiments, in the etching the fin liner layer, the fin liner formed over the upper portion of the wall fin is fully removed. In one or more of the foregoing or the following embodiments, the fin liner layer includes silicon nitride. In one or more of the foregoing or the following embodiments, the source/drain epitaxial layers are in contact with the recessed third dielectric layer of the wall fin.

In accordance with another aspect of the present disclosure, in a method of manufacturing a semiconductor device, a first dielectric layer is formed over a plurality of semiconductor fins disposed over a semiconductor substrate such that a first space remains between adjacent semiconductor fins, a second dielectric layer is formed over the first dielectric layer such that the first space is fully filled by the second dielectric layer, the second dielectric layer is recessed below a top of each of the plurality of semiconductor fins such that a second space is formed above the recessed second dielectric layer between adjacent semiconductor fins covered by the first dielectric layer, a third dielectric layer is formed over the recessed second dielectric layer such that the second space is fully filled by the third dielectric layer, the third dielectric layer is recessed below the top of each of the plurality of semiconductor fins, thereby forming wall fins disposed between the adjacent semiconductor fins, the first dielectric layer is recessed below a top of each of the wall fins, a sacrificial gate structure is formed over an upper portion of each of the plurality of semiconductor fins and an upper portion of each of the wall fins, which protrude from the recessed first dielectric layer, a fin liner layer is formed over an upper portion of each of the plurality of semiconductor fins and an upper portion of each of the wall fins, which protrude from the recessed first dielectric layer and are not covered by the sacrificial gate structure, the fin liner layer is etched and the plurality of semiconductor fins are recessed, source/drain epitaxial layers are formed over the plurality of recessed semiconductor fins, respectively, and the sacrificial gate structure is replaced with a metal gate structure. The source/drain epitaxial layers are separated by the wall fins from each other. In one or more of the foregoing or the following embodiments, the first dielectric layer, the second dielectric layer and the third dielectric layer are made of different dielectric materials from each other. In one or more of the foregoing or the following embodiments, the third dielectric layer includes at least one selected from the group consisting of hafnium oxide, aluminum oxide, zinc oxide and zirconium oxide. In one or more of the foregoing or the following embodiments, the first dielectric layer includes silicon oxide and the second dielectric layer includes silicon nitride. In one or more of the foregoing or the following embodiments, in the etching the fin liner layer, a part of the fin liner layer formed over the upper portion of each of the plurality of semiconductor fins remains, and the fin liner formed over the upper portion of each of the wall fins is fully removed. In one or more of the foregoing or the following embodiments, an interface between the recessed second dielectric layer and the recessed third dielectric layer in each of the wall fins is located above an upper surface of the recessed first dielectric layer. In one or more of the foregoing or the following embodiments, before the first dielectric layer is formed, a hard mask pattern is formed on the top of each of the plurality of the semiconductor fins. In one or more of the foregoing or the following embodiments, the first space is fully filled by the second dielectric layer.

In accordance with another aspect of the present disclosure, in a method of manufacturing a semiconductor device, a first dielectric layer is formed over semiconductor fins disposed over a semiconductor substrate, a second dielectric layer is formed over the first dielectric layer, the second dielectric layer is recessed below a top of each of the semiconductor fins, a third dielectric layer is formed over the recessed second dielectric layer, and the third dielectric layer is recessed below the top of the semiconductor fin, thereby forming a wall fin disposed between the semiconductor fins.

The wall fin includes the recessed third dielectric layer and the recessed second dielectric layer disposed over the recessed third dielectric layer. The first dielectric layer is recessed below a top of the wall fin. A sacrificial gate structure is formed, the semiconductor fins not covered by the sacrificial gate structure are recessed, and source/drain epitaxial layers are formed over the recessed semiconductor fins, respectively. The source/drain epitaxial layers are separated by the wall fin from each other. In one or more of the foregoing or the following embodiments, the source/drain epitaxial layers are in contact with the recessed third dielectric layer of the wall fin. In one or more of the foregoing or the following embodiments, an interface between the recessed second dielectric layer and the recessed third dielectric layer in the wall fin is located below an upper surface of the recessed first dielectric layer.

In accordance with one aspect of the present disclosure, a semiconductor device includes a first semiconductor fin and a second semiconductor fin disposed over a semiconductor substrate and extending in a first direction, an isolation insulating layer disposed between the first semiconductor fin and the second semiconductor fin, a wall fin extending in the first direction, wherein a lower portion of the wall fin is embedded in the isolation insulating layer and a upper portion of the wall fin protrudes from the isolation insulating layer, a gate structure disposed over a channel region of the first semiconductor fin and a channel region of the second semiconductor fin and extending in a second direction crossing the first direction, and a first source/drain epitaxial layer disposed over a source/drain region of the first semiconductor fin and a second source/drain epitaxial layer disposed over a source/drain region of the second semiconductor fin. The first source/drain epitaxial layer and the second source/drain epitaxial layer are separated by the wall fin. The wall fin includes a lower dielectric layer and an upper dielectric layer disposed over the lower dielectric layer and made of a different material than the lower dielectric layer. The upper dielectric layer includes a dielectric material having a dielectric constant higher than the lower dielectric layer and the isolation insulating layer. In one or more of the foregoing or the following embodiments, the upper dielectric layer includes at least one selected from the group consisting of $HfO_2$, HfSiO, HfSiON, HfTaO, HfTiO, HfZrO, zirconium oxide, aluminum oxide, titanium oxide, and a hafnium dioxide-alumina ($HfO_2$—$Al_2O_3$) alloy. In one or more of the foregoing or the following embodiments, the lower dielectric layer includes at least one selected from the group consisting of silicon nitride, silicon oxynitride, SiOC and SiOCN. In one or more of the foregoing or the following embodiments, an interface between the lower dielectric layer and the upper dielectric layer in the wall fin is located above an upper surface of the isolation insulating layer. In one or more of the foregoing or the following embodiments, the interface between the lower dielectric layer and the upper dielectric layer in the wall fin is located below a level where at least one of first source/drain epitaxial layer and the second source/drain epitaxial layer has a widest width along the second direction. In one or more of the foregoing or the following embodiments, an interface between the lower dielectric layer and the upper dielectric layer in the wall fin is located below an upper surface of the isolation insulating layer. In one or more of the foregoing or the following embodiments, a top of the wall fin is located below a top of the channel region of each of the first semiconductor fin and the second semiconductor fin. In one or more of the foregoing or the following embodiments, an interface between the source/drain region of the first semiconductor fin and the first source/drain epitaxial layer is located below an upper surface of the isolation insulating layer.

In accordance with another aspect of the present disclosure, a semiconductor device includes a first semiconductor fin and a second semiconductor fin disposed over a semiconductor substrate, an isolation insulating layer disposed between the first semiconductor fin and the second semiconductor fin, a wall fin extending in the first direction, wherein a lower portion of the wall fin is embedded in the isolation insulating layer and a upper portion of the wall fin protrudes from the isolation insulating layer, a gate structure disposed over a channel region of the first semiconductor fin and a channel region of the second semiconductor fin, a first source/drain epitaxial layer disposed over a source/drain region of the first semiconductor fin and a second source/drain epitaxial layer disposed over a source/drain region of the second semiconductor fin, and a first fin liner layer disposed on a bottom part of the first source/drain epitaxial layer, and a second fin liner layer disposed on a bottom part of the second source/drain epitaxial layer. The first source/drain epitaxial layer and the second source/drain epitaxial layer are separated by the wall fin, the wall fin includes a lower dielectric layer and an upper dielectric layer disposed over the lower dielectric layer and made of a different material than the lower dielectric layer, and the upper dielectric layer, the lower dielectric layer and the isolation insulating layer re made of different material from each other. In one or more of the foregoing or the following embodiments, the upper dielectric layer includes doped or non-doped hafnium oxide. In one or more of the foregoing or the following embodiments, the lower dielectric layer includes silicon nitride. In one or more of the foregoing or the following embodiments, the fin liner layer includes silicon nitride. In one or more of the foregoing or the following embodiments, an interface between the lower dielectric layer and the upper dielectric layer in the wall fin is located above an upper surface of the isolation insulating layer. In one or more of the foregoing or the following embodiments, the interface between the lower dielectric layer and the upper dielectric layer in the wall fin is located above a top of the fin liner layer. In one or more of the foregoing or the following embodiments, the interface between the lower dielectric layer and the upper dielectric layer in the wall fin is located below a level where at least one of first source/drain epitaxial layer and the second source/drain epitaxial layer has a widest width along a gate extending direction. In one or more of the foregoing or the following embodiments, the first and second source/drain epitaxial layers are in contact with the upper portion of the wall fin. In one or more of the foregoing or the following embodiments, no void is formed below the lower dielectric layer in the wall fin.

In accordance with another aspect of the present disclosure, a semiconductor device includes semiconductor fins disposed over a semiconductor substrate and extending in a first direction, an isolation insulating layer disposed over the semiconductor substrate, wall fins disposed over the substrate, wherein a lower portion of each of the wall fins is embedded in the isolation insulating layer and a upper portion of the wall fin protrudes from the isolation insulating layer, a gate structure disposed over a channel region of each of the semiconductor fins, and source/drain epitaxial layers disposed source/drain regions of the semiconductor fins, respectively. The source/drain epitaxial layers are separated by the wall fins, respectively, from an adjacent source/drain epitaxial layer, each of the wall fins includes a lower dielectric layer and an upper dielectric layer disposed over the lower dielectric layer and made of a different material than the lower dielectric layer, and the upper dielectric layer includes a dielectric material having a dielectric constant higher than the lower dielectric layer and the isolation insulating layer. In one or more of the foregoing or the following embodiments, the gate structure is disposed over the wall fins. In one or more of the foregoing or the following embodiments, the upper dielectric layer includes doped or non-doped hafnium oxide.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a first dielectric layer over semiconductor fins disposed over a semiconductor substrate;
    forming a second dielectric layer over the first dielectric layer;
    recessing the second dielectric layer below a top of each of the semiconductor fins;
    forming a third dielectric layer over the recessed second dielectric layer;
    recessing the third dielectric layer below the top of each of the semiconductor fins, thereby forming a wall fin disposed between the semiconductor fins, the wall fin comprising the recessed third dielectric layer and the recessed second dielectric layer disposed under the recessed third dielectric layer;
    recessing the first dielectric layer below a top of the wall fin;
    forming a fin liner layer over an upper portion of each of the semiconductor fins and an upper portion of the wall fin, which protrude from the recessed first dielectric layer;
    etching the fin liner layer and recessing the semiconductor fins; and
    forming source/drain epitaxial layers over the recessed semiconductor fins, respectively,
    wherein the source/drain epitaxial layers are separated by the wall fin from each other.

2. The method of claim 1, wherein the first dielectric layer, the second dielectric layer and the third dielectric layer are made of different dielectric materials from each other.

3. The method of claim 2, wherein the third dielectric layer includes hafnium oxide.

4. The method of claim 3, wherein the second dielectric layer includes silicon nitride.

5. The method of claim 4, wherein the first dielectric layer includes silicon oxide.

6. The method of claim 2, wherein in the etching the fin liner layer, a part of the fin liner layer formed over the upper portion of each of the semiconductor fins remains.

7. The method of claim 6, wherein in the etching the fin liner layer, the fin liner formed over the upper portion of the wall fin is fully removed.

8. The method of claim 6, wherein the fin liner layer includes silicon nitride.

9. The method of claim 2, wherein the source/drain epitaxial layers are in contact with the recessed third dielectric layer of the wall fin.

10. A method of manufacturing a semiconductor device, the method comprising:
    forming a first dielectric layer over a plurality of semiconductor fins disposed over a semiconductor substrate such that a first space remains between adjacent semiconductor fins;
    forming a second dielectric layer over the first dielectric layer such that the first space is fully filled by the second dielectric layer;
    recessing the second dielectric layer below a top of each of the plurality of semiconductor fins such that a second space is formed above the recessed second dielectric layer between adjacent semiconductor fins covered by the first dielectric layer;
    forming a third dielectric layer over the recessed second dielectric layer such that the second space is fully filled by the third dielectric layer;
    recessing the third dielectric layer below the top of each of the plurality of semiconductor fins, thereby forming wall fins disposed between the adjacent semiconductor fins;
    recessing the first dielectric layer below a top of each of the wall fins;
    forming a fin liner layer over an upper portion of each of the plurality of semiconductor fins and an upper portion of each of the wall fins, which protrude from the recessed first dielectric layer;
    etching the fin liner layer and recessing the plurality of semiconductor fins; and
    forming source/drain epitaxial layers over the plurality of recessed semiconductor fins, respectively,
    wherein the source/drain epitaxial layers are separated by the wall fins from each other.

11. The method of claim 10, wherein the first dielectric layer, the second dielectric layer and the third dielectric layer are made of different dielectric materials from each other.

12. The method of claim 11, wherein the third dielectric layer includes at least one selected from the group consisting of hafnium oxide, aluminum oxide, zinc oxide and zirconium oxide.

13. The method of claim 12, wherein the first dielectric layer includes silicon oxide and the second dielectric layer includes silicon nitride.

14. The method of claim 10, wherein in the etching the fin liner layer, a part of the fin liner layer formed over the upper portion of each of the plurality of semiconductor fins remains, and the fin liner formed over the upper portion of each of the wall fins is fully removed.

15. The method of claim 10, wherein an interface between the recessed second dielectric layer and the recessed third dielectric layer in each of the wall fins is located above an upper surface of the recessed first dielectric layer.

16. The method of claim 10, wherein before the first dielectric layer is formed, a hard mask pattern is formed on the top of each of the plurality of the semiconductor fins.

17. The method of claim 10, wherein the first space is fully filled by the second dielectric layer.

18. The method of claim 10, further comprising:
    forming a sacrificial gate structure over an upper portion of each of the plurality of semiconductor fins and an upper portion of each of the wall fins, which protrude from the recessed first dielectric layer; and after the source/drain epitaxial layers are formed, replacing the sacrificial gate structure with a metal gate structure.

19. A method of manufacturing a semiconductor device, the method comprising:
    forming a first dielectric layer over semiconductor fins disposed over a semiconductor substrate;
    forming a second dielectric layer over the first dielectric layer;
    recessing the second dielectric layer below a top of each of the semiconductor fins;
    forming a third dielectric layer over the recessed second dielectric layer;
    recessing the third dielectric layer below the top of each of the semiconductor fins, thereby forming a wall fin disposed between the semiconductor fins, the wall fin comprising the recessed third dielectric layer and the recessed second dielectric layer disposed under the recessed third dielectric layer;
    recessing the first dielectric layer below a top of the wall fin;
    forming a fin liner layer over an upper portion of each of the semiconductor fins and an upper portion of the wall fin, which protrude from the recessed first dielectric layer;
    etching the fin liner layer and recessing the semiconductor fins; and
    forming source/drain epitaxial layers over the recessed semiconductor fins, respectively,
    wherein the third dielectric layer is made of a high-k dielectric material.

20. The method of claim 19, wherein:
    the source/drain epitaxial layers are in contact with the recessed third dielectric layer of the wall fin, and
    an interface between the recessed second dielectric layer and the recessed third dielectric layer in the wall fin is located below an upper surface of the recessed first dielectric layer.

* * * * *